United States Patent
Mizutani

[11] Patent Number: 6,084,788
[45] Date of Patent: Jul. 4, 2000

[54] NEUTRAL POINT CLAMPED POWER CONVERTER

[75] Inventor: Mami Mizutani, Tokyo, Japan

[73] Assignee: Kabushiki Kaisha Toshiba, Kawasaki, Japan

[21] Appl. No.: 09/222,081

[22] Filed: Dec. 29, 1998

Related U.S. Application Data

[62] Division of application No. 08/864,678, May 28, 1997, Pat. No. 5,953,222.

[30] Foreign Application Priority Data

Jun. 18, 1996 [JP] Japan ................................ P08-177558

[51] Int. Cl.$^7$ .................................................. H02M 7/122
[52] U.S. Cl. ............................................. 363/56; 363/132
[58] Field of Search .............................. 363/56, 58, 132, 363/136, 137; 307/125

[56] References Cited

U.S. PATENT DOCUMENTS

| | | | |
|---|---|---|---|
| 4,855,893 | 8/1989 | Kratz | 363/136 |
| 4,881,159 | 11/1989 | Holtz et al. | 363/58 |
| 5,383,108 | 1/1995 | Okayama | 363/137 |
| 5,444,594 | 8/1995 | Tanaka et al. | 363/55 |
| 5,459,655 | 10/1995 | Mori et al. | 363/132 |
| 5,535,085 | 7/1996 | Tanaka et al. | 363/55 |
| 5,731,970 | 3/1998 | Mori et al. | 363/132 |
| 5,801,936 | 9/1998 | Mori et al. | 363/132 |
| 5,811,878 | 9/1998 | Harmoinen et al. | 257/723 |

*Primary Examiner*—Adolf Deneke Berhane
*Attorney, Agent, or Firm*—Oblon, Spivak, McClelland, Maier & Neustadt, P.C.

[57] ABSTRACT

A switching module, including a first self-turn-off device, a second self-turn-off device connected in series with the first self-turn-off device, a first diode connected in antiparallel with the first self-turn-off device, a second diode connected in antiparallel with the second self-turn-off device, and a third diode with its cathode connected to a connecting point of the first and second self-turn-off devices. The switching module further includes a first external terminal connected to a positive side terminal of the first self-turn-off device, a second external terminal connected to a negative side terminal of the second self-turn-off device, a third external terminal connected to an anode of the third diode, a first external control terminal connected to a control signal terminal of the first self-turn-off device, and a second external control terminal connected to a control signal terminal of the second self-turn-off device.

7 Claims, 21 Drawing Sheets

(a)

(b)

(a)

(b)

(a)

(b)

(a)

(b)

NEUTRAL POINT CLAMPED POWER CONVERTER

This application is a division of Ser. No. 08/864,678 filed May 28, 1997 now U.S. Pat. No. 5,953,222.

BACKGROUND OF THE INVENTION

1. Field of the Invention

This invention relates to a switching module, a power converter and a power converter composed of using the switching modules, and more particularly to a switching module composed of a plurality of series connected self-turn-off devices, a power converter with low-loss snubber circuits and a power converter with low-loss snubber circuits composed of using the switching modules.

2. Description of the Related Art

A switching module SM0 composed of a single self-turn-off device so far used is shown in FIG. 25. This switching module SM0 is composed of a single self-turn-off device S1, such as an IGBT (Insulated Gate Bipolar Transistor), and a single freewheeling diode D1 which is connected in anti-parallel with self-turn-off device S1. A collector terminal (a positive side terminal) of self-turn-off device S1 is led out as a first external terminal 1 and an emitter terminal (a negative side terminal) of self-turn-off device S1 is led out as a second external terminal 2, and further, gate signal terminals 30 for the ON/OFF control of self-turn-off device S1 are led out of switching module SM0.

An example of the configuration of a conventional neutral point clamped power converter (hereinafter referred to as "NPC inverter") for one phase, which is composed of using such switching modules SM0 is shown in FIG. 26. Further, a circuit configuration diagram of the NPC inverter shown in FIG. 26 is illustrated in FIG. 27.

The NPC inverter illustrated in FIGS. 26 and 27 is composed of 4 pieces of the series connected switching modules SM01–SM04, which are respectively composed of a single self-turn-off device S1, S2, S3 and S4 and a single freewheeling diode D1, D2, D3 and D4 connected in anti-parallel with them. Switching modules SM01–SM04 are connected in series by connecting external terminal 2 of the positive side switching module to external terminal 1 of the negative side switching module. Further, each of self-turn-off devices S1, S2, S3 and S4 is connected in parallel with a snubber circuit. Each of the snubber circuits is composed of a snubber diode Ds, a snubber capacitor Cs which is series connected to snubber diode Ds and a snubber resistor Rs which is connected in parallel with snubber diode Ds. Numerical codes 1–4 suffixed to the devices indicate corresponding modules SM01–SM04. Between a connecting point of switching modules SM01 and SM02 and a connecting point of switching modules SM03 and SM04, clamp diodes Dc1 and Dc2 are connected in series in the direction reverse to the polarity of self-turn-off devices S1–S4. From a DC voltage source (Voltage Vd=Vd1+Vd2) composed of capacitors Cp1 and Cp2 with voltages Vd1 and Vd2, a positive side terminal 10, a zero-voltage terminal 11 and a negative side terminal 12 are led out. Series connected four pieces of switching modules SM01–SM04 are connected between positive and negative side terminals 10 and 12 through line inductances L1, L3. Further, the connecting point of clamp diodes Dc1, Dc2 is connected to zero-voltage terminal 11 and a line inductance L2 is also shown here. From the connecting point of both switching modules SM02 and SM03, an output terminal 20 of NPC inverter is led out.

Next, the operation of the NPC inverter shown in FIGS. 26 and 27 will be described.

One example of the relationship of the switching operation and voltage levels of the self-turn-off devices S1–S4 is shown below. This NPC inverter outputs voltage Vd1 when self-turn-off devices S1 and S2 are ON, outputs zero voltage when self-turn-off devices S2 and S3 are ON, and outputs voltage −Vd2 when self-turn-off devices S3 and S4 are ON. For making the description simple, it is assumed that Vd1=Vd2=Vd/2.

In the NPC inverter, for instance, if self-turn-off devices S1–S3 are turned ON simultaneously, a short-circuit of DC voltage Vd1 is formed in the route of self-turn-off devices S1–S2–S3 and clamp diode Dc2, and excessive short-circuit current flows through devices in the short-circuit. To prevent this short-circuit current, self-turn-off devices S1 and S3 are reversely operated (when one of them is ON, the other is OFF) and the self-turn-off devices S2 and S4 are also reversely operated.

Next, the operation of the snubber circuits shown in FIGS. 26 and 27 will be described. Each of the snubber circuit is arranged close to respective self-turn-off devices S1–S4 to reduce the influence of the line inductance. If self-turn-off device S1 is turned OFF in the state wherein current is flowing through line inductance L1 and self-turn-off devices S1 and S2, the residual energy of line inductance L1 charges snubber capacitor Cs1 via snubber diode Ds1 as shown in FIG. 28. The voltage of capacitor Cs1 becomes the sum of DC voltage Vd1 and the voltage by the residual energy of line inductance L1. The charge in snubber capacitor Cs1 is discharged through the route of snubber capacitor Cs1→snubber resistor Rs1→self-turn-off device S1 when self-turn-off device S1 is next turned ON and the charge in snubber capacitor Cs1 drops nearly to zero. This also applies to other self-turn-off devices S2–S4 as shown in FIG. 29.

In switching module SM0 illustrated in FIG. 25, the wiring length between self-turn-off device S1 and freewheeling diode D1 connected in antiparallel with it becomes short and the line inductance between them can be reduced. But the inductance of wires required between switching module SM0 and other devices cannot be reduced. Further, in case of the snubber circuit in the circuit configuration shown in FIG. 27, the snubber energy is all consumed by snubber resistors Rs1–Rs4 and therefore, its efficiency becomes worse.

In an effort to solve this defect, a low-loss snubber circuit for NPC inverter is proposed (1995 National Convention of the Institute of Electrical Engineers of Japan, Report, No. 5, p. 320, 1178: "Clamp-Snubber for 3-Level-Inverter") This proposed snubber circuit is shown in FIG. 30.

FIG. 30 shows one example of a main circuit configuration for a single phase of an NPC inverter using such low-loss snubber circuits. Further, for the circuit shown in FIG. 30, an example of a main circuit configuration for a single phase of an NPC inverter applied with conventional switching modules SM0 shown in FIG. 25 is shown in FIG. 31.

In FIGS. 30 and 31, snubber diodes Ds1–Ds4, Ds22 and Ds32, snubber capacitors Cs1–Cs4 and snubber resistors Rs1–Rs4 were added as snubber circuit elements for the discharging snubber circuits of the NPC inverter shown in FIGS. 26 and 27.

The operation of the NPC inverter using low-loss snubber circuits shown in FIGS. 30 and 31 will be described. When self-turn-off device S1 is turned OFF in the state wherein the current is flowing via line inductance L1 and self-turn-off devices S1 and S2, the voltage of self-turn-off device S1 rises by the residual energy of line inductance L1. When the voltage of self-turn-off device S1 exceeds the voltage of snubber capacitor Cs1, a forward voltage is applied to snubber diode Ds1 and snubber diode Ds1 becomes the ON state. As a result, the residual energy of line inductance L1 flows into snubber capacitor Cs1. At this time, if the voltage of snubber capacitor Cs1 rises higher than DC voltage Vd1, excess voltage is discharged by snubber resistor Rs1 so that the voltage of snubber capacitor Cs1 becomes equal to voltage Vd1.

These states are shown in FIG. 32 and FIG. 33. The voltage of snubber capacitor Cs1 is applied to self-turn-off device S1, and then DC voltage Vd1 is steadily applied thereto. When self-turn-off device S1 is turned ON, capacitor Cs1 does not discharge and is kept being clamped at DC voltage Vd1. Therefore, excess voltage only at the time of turn-OFF is discharged through snubber resistor Rs1 and thus, a low-loss snubber circuit can be achieved.

Next, the operation when self-turn-off device S2 is turned OFF will be described. When self-turn-off device S2 is turned OFF in the state wherein self-turn-off device S2 is in the ON state and the current is flowing through line inductance L2, clamp diode Dc1 and self-turn-off device S2, the voltage of self-turn-off device S2 is raised by the residual energy of line inductance L2. If terminal voltage of self-turn-off device S2 exceeds the voltage of snubber capacitor Cs2, snubber diode Ds2 becomes the ON state and the residual energy of line inductance L2 flows into snubber capacitor Cs2. As a result, the voltage of snubber capacitor Cs2 rises, and snubber capacitor Cs2 is kept charged as there is no place for the charge to go even when the voltage of snubber capacitor Cs2 becomes higher than DC voltage Vd2. The circuit diagram in this state is shown in FIG. 34.

FIG. 35 shows the route for discharging overcharged charge of snubber capacitor Cs2. When self-turn-off device S2 is turned ON next, self-turn-off device S3 is also in the ON state according to the switching control described above. The discharging route is in the order of snubber capacitor Cs2→self-turn-off device S2→self-turn-off device S3→clamp diode Dc2→DC voltage source Cp2→snubber diode Ds22→snubber resistor Rs2. The voltage of snubber capacitor Cs2 is clamped at voltage Vd2 and only voltage in excess of voltage Vd2 is discharged via snubber resistor Rs2. This is also the same in the snubber circuits of self-turn-off devices S3 and S4.

For the conventional low-loss snubber circuits shown in FIGS. 30 and 31, snubber diodes Ds22 and Ds32 become newly required. The operation of these diodes Ds22 and Ds32 will be described in the following. For instance, when self-turn-off devices S1 and S2 are in the ON state, the potential at the positive side terminal of self-turn-off device S2, that is, at one end of snubber capacitor Cs2 becomes equal to the potential at positive side terminal 10 of the DC voltage source. When assuming that there is no snubber diode Ds22, the potential at the other end of snubber capacitor Cs2 becomes equal to the potential at negative side terminal 12 of the DC voltage source. That is, snubber diode Ds22 is needed to prevent the state that total voltage of the DC voltage source is applied to snubber capacitor Cs2, that is, total voltage of the DC voltage source is applied to self-turn-off device S2. In the same manner, snubber diode Ds32 prevents application of total voltage of the DC power source to self-turn-off device S3.

In the circuit configuration of the NPC inverter using conventional low-loss snubber circuits shown in FIGS. 30 and 31, there is such a problem that the combination of the self-turn-off devices in the ON/OFF switching must be self-turn-off devices S1 and S2, self-turn-off devices S2 and S3, and self-turn-off devices S3 and S4. Here, there is an example of other switching control system proposed in the Japanese Patent Disclosure (Kokai) No. Hei, 4-295279.

According to this control system, it is possible to reduce loss by eliminating useless switching operation by turning ON self-turn-off devices only which is required depending on the output current direction. That is, when the output current is positive, self-turn-off devices S1 and S2 are ON and the output voltage level is Vd1 (Vd/2);

when the output current is positive, self-turn-off device S2 is ON and the voltage level is 0 volts;

when the output current is negative, self-turn-off device S3 is ON and the voltage level is 0 volts; and when the output current is negative, self-turn-off devices S3 and S4 are ON and the voltage level is −Vd2 (=−Vd/2).

In other words, when the output current is positive, self-turn-off devices S3 and S4 are kept OFF so that the useless switching thereof is not carried out. Further, when the output current is negative, self-turn-off devices S1 and S2 are kept OFF and no useless switching thereof is carried out. Thus, the switching loss can be reduced.

However, when it is tried to apply this control system to the NPC inverter using convention low-loss snubber circuits shown in FIGS. 30 and 31, a problem described below will arise.

That is, for instance, when the output current is positive, it may be needed to turn ON/OFF self-turn-off device S2 while self-turn-off devices S3 and S4 are kept in the OFF state. In this case, even when self-turn-off device S2 is turned ON, as self-turn-off device S3 is kept in the OFF state excess voltage of snubber capacitor Cs2 is not discharged. Therefore, the voltage of snubber capacitor Cs2 rises every time when self-turn-off device S2 is turned OFF, and finally, snubber capacitor Cs2 is charged up to the total voltage (Vd=Vd1+Vd2) of the DC voltage source. As a result, the voltage of self-turn-off device S2 becomes overvoltage. It is therefore difficult to apply the control system described above to the NPC inverter having low-loss snubber circuits shown in FIGS. 30 and 31.

The conventional switching module and the conventional power converter described above have the following problems.

1. When a power converter is composed using conventional switching modules, external wirings become long, line inductances increase and as a result, troubles in the circuit operation are caused.

2. To reduce an influence of line inductances, it is required to arrange a snubber circuit as close to a switching module as possible, and therefore, the snubber circuit configuration is restricted.

3. A conventional snubber circuit installed close to a switching module has a large loss and the efficiency of a power converter becomes worse. In connection with this, a cooling equipment inevitably becomes large in size.

4. A neutral point clamped power converter equipped with a conventional low-loss snubber circuit has a restriction for switching control and self-turn-off devices may be subject to application of excessive voltage depending on a control system.

SUMMARY OF THE INVENTION

Accordingly, one object of this invention is to provide a switching module which can reduce line inductances in a main circuit of a power converter, can achieve the downsizing of the entire system of the power converter and can facilitate to compose a low-loss snubber circuit.

Another object of this invention is to provide a highly efficient power converter equipped with low-loss snubber circuits.

A further object of this invention is to provide a power converter having low-loss snubber circuits which is equipped with a main circuit hardly subject to the restriction of the switching control of self-turn-off devices.

Still another object of this invention is to provide a highly efficient power converter composed of using the switching module, equipped with low-loss snubber circuits.

These and other objects of this invention can be achieved by providing a switching module, including a first self-turn-off device, a second self-turn-off device connected in series with the first self-turn-off device, a first diode connected in antiparallel with the first self-turn-off device, a second diode connected in antiparallel with the second self-turn-off device, and a third diode with its cathode connected to a connecting point of the first and second self-turn-off devices. The switching module further includes a first external terminal connected to a positive side terminal of the first self-turn-off device, a second external terminal connected to a negative side terminal of the second self-turn-off device, a third external terminal connected to an anode of the third diode, a first external control terminal connected to a control signal terminal of the first self-turn-off device, and a second external control terminal connected to a control signal terminal of the second self-turn-off device.

According to one aspect of this invention, there is provided a switching module, including a first self-turn-off device, a second self-turn-off device connected in series with the first self-turn-off device, a first diode connected in antiparallel with the first self-turn-off device, a second diode connected in antiparallel with the second self-turn-off device, and a third diode with its anode connected to a connecting point of the first and second self-turn-off devices. The switching module further includes a first external terminal connected to a positive side terminal of the first self-turn-off device, a second external terminal connected to a negative side terminal of the second self-turn-off device, a third external terminal connected to a cathode of the third diode, a first external control terminal connected to a control signal terminal of the first self-turn-off device, and a second external control terminal connected to a control signal terminal of the second self-turn-off device.

According to another aspect of this invention, there is provided a neutral point clamped power converter, including a DC voltage source with a positive side terminal, a zero-voltage terminal and a negative side terminal, a first switching module composed of the switching module as described above, a second switching module composed of the switching module as described above, and an output terminal of the neutral point clamped power converter connected to the second external terminal of the first switching module and the first external terminal of the second switching module. The first external terminal of the first switching module is connected to the positive side terminal of the DC voltage source, the third external terminal of the first switching module and the third external terminal of the second switching module are connected to the zero-voltage terminal of the DC voltage source, and the second external terminal of the second switching module is connected to the negative side terminal of the DC voltage source. The neutral point clamped power converter further includes a first snubber diode with its cathode connected to the third external terminal of the first switching module, a first snubber capacitor connected between an anode of the first snubber diode and the first external terminal of the first switching module, a first snubber resistor connected in parallel with the first snubber capacitor, a second snubber diode with its cathode connected to the second external terminal of the first switching module, a second snubber capacitor connected between an anode of the second snubber diode and the third external terminal of the first switching module, a second snubber resistor connected between the anode of the second snubber diode and the negative side terminal of the DC voltage source, a third snubber diode with its anode connected to the first external terminal of the second switching module, a third snubber capacitor connected between a cathode of the third snubber diode and the third external terminal of the second switching module, a third snubber resistor connected between the cathode of the third snubber diode and the positive side terminal of the DC voltage source, a fourth snubber diode with its anode connected to the third external terminal of the second switching module, a fourth snubber capacitor connected between a cathode of the fourth snubber diode and the second external terminal of the second switching module, and a fourth snubber resistor connected in parallel with the fourth snubber capacitor.

According to still another aspect of this invention, there is provided a neutral point clamped power converter, including a DC voltage source with a positive side terminal, a zero-voltage terminal and a negative side terminal, a series circuit of a first self-turn-off device a second self-turn-off device, a third self-turn-off device, and a fourth self-turn-off device, a first diode connected in antiparallel with the first self-turn-off device, a second diode connected in antiparallel with the second self-turn-off device, a third diode connected in antiparallel with the third self-turn-off device, a fourth diode connected in antiparallel with the fourth self-turn-off device, and an output terminal of the neutral point clamped power converter connected to a connecting point of the second and third self-turn-off devices. The positive side terminal of the first self-turn-off device is connected to the positive side terminal of the DC voltage source, and the negative side terminal of the fourth self-turn-off device is connected to the negative side terminal of the DC voltage source. The neutral point clamped power converter further includes a fifth diode with its cathode connected to a connecting point of the first and second self-turn-off devices and its anode connected to the zero-voltage terminal of the DC voltage source, a sixth diode with its anode connected to a connecting point of the third and fourth self-turn-off devices and its cathode connected to the zero-voltage terminal of the DC voltage source, a seventh diode with its cathode connected to the connecting point of the second and third self-turn-off devices, an eighth diode with its anode connected to the connecting point of the second and third self-turn-off devices, a ninth diode with its cathode connected to the anode of the fifth diode, and a tenth diode with its anode connected to the cathode of the sixth diode. The neutral point clamped power converter also includes a first capacitor connected between an anode of the ninth diode and the positive side terminal of the first self-turn-off device, a first resistor connected in parallel with the ninth diode, a second capacitor connected between the anode of the fifth diode and an anode of the seventh diode, a second resistor connected between the anode of the seventh diode and the negative side terminal of the DC voltage source, a third resistor connected between a cathode of the eighth diode and the positive side terminal of the DC voltage source, a third capacitor connected between the cathode of the sixth diode and the cathode of the eighth diode, a fourth capacitor connected between a cathode of the tenth diode and the negative side terminal of the fourth self-turn-off device, and a fourth resistor connected in parallel with the tenth diode.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
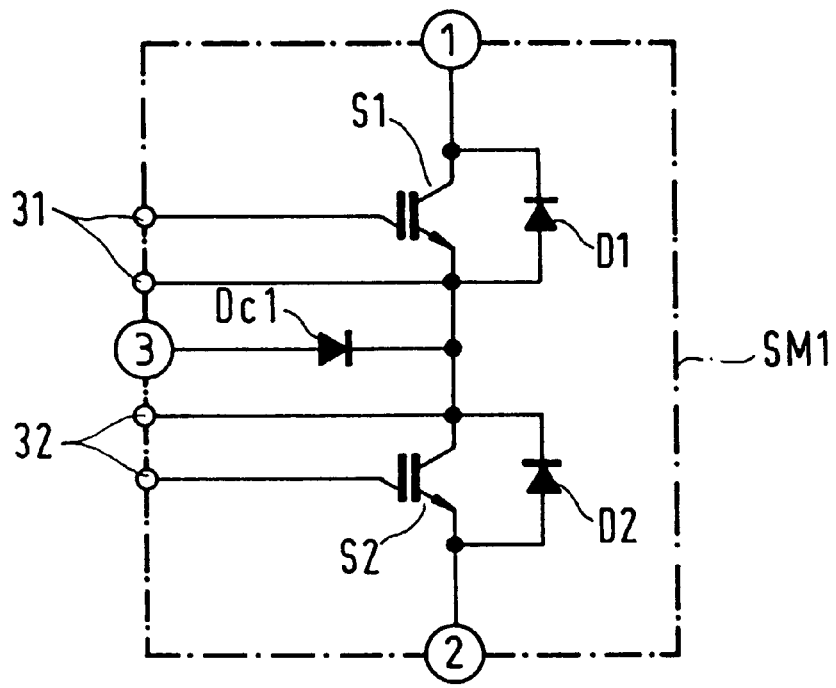
FIG. 1 is a diagram showing a configuration of a switching module according to a first embodiment of this invention.

Referring now to the drawings, wherein like reference numerals designate identical or corresponding parts throughout the several views, the embodiments of this invention will be described below.

FIG. 1 illustrates a configuration of a switching module SM1 according to a first embodiment of the present invention. This switching module SM1 is composed of, two series connected self-turn-off devices S1 and S2, composed of, for instance IGBTs, freewheeling diodes D1 and D2 connected in antiparallel to self-turn-off devices S1 and S2, respectively, and clamp diode Dc1 with its cathode connected to the connecting point of two self-turn-off devices S1 and S2. In switching module SM1, a collector, that is the positive side terminal, of self-turn-off device S1 is led out as first external terminal 1, an emitter, that is the negative side terminal, of self-turn-off device S2 is led out as second external terminal 2, the anode of clamp diode Dc1 is led out as a third external terminal 3, and further, gate signal terminals 31 and 32 of respective self-turn-off devices S1 and S2 are led out to the outside.

Figure 2:
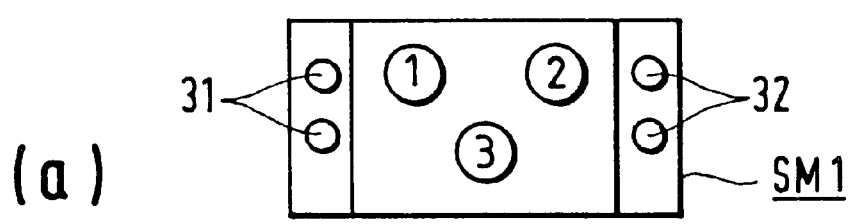
FIG. 2 is a diagram showing a construction of the switching module shown in FIG. 1, wherein (a) shows a plan view thereof and (b) shows a front view thereof.
Figure 2:
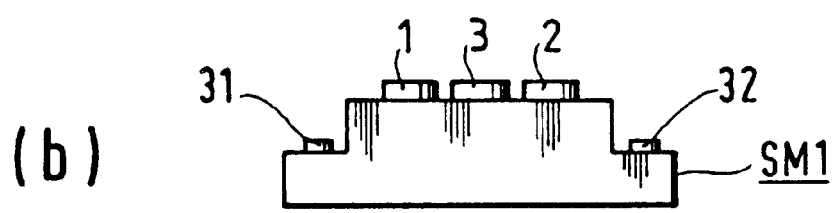

FIG. 2 shows an example of the configuration of switching module SM1 shown in FIG. 1. In FIG. 2, (a) shows a plan view thereof and (b) shows a front view thereof. In FIG. 2, there are formed first through third external terminals 1, 2 and 3 on the center of the top of switching module SM1 at nearly equal spaces and gate signal terminals 31 and 32 at the lower tier ends of switching module SM1.

Further, switching module SM1 provided with clamp diode Dc1 is used in a neutral point clamped power converter by connecting it to the positive side of a DC voltage source.

It is possible to reduce line inductances in the main circuit of the power converter by consolidating two self-turn-off devices S1, S2 and three diodes D1, D2, Dc1 for composing the power converter into single switching module SM1. In particular, it is possible to make the switching module easy to compose a low-loss snubber circuit by making the wiring between diode Dc1 which functions as a clamp diode and the connecting point between two self-turn-off devices S1, S2 extremely small and thus, the entire circuit can be downsized.

Figure 3:
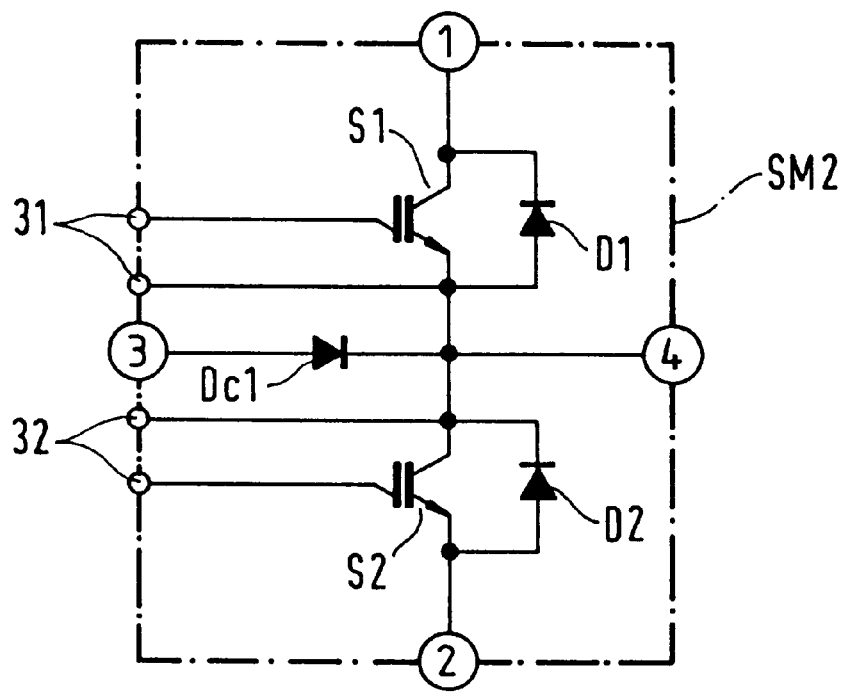
FIG. 3 is a diagram showing a configuration of a switching module according to a second embodiment of this invention.

FIG. 3 illustrates a configuration of a switching module SM2 according to a second embodiment of the present invention. When compared with switching module SM1 shown in FIGS. 1 and 2, switching module SM2 shown here features that the connecting point between two self-turn-off devices S1, S2, that is, the cathode of diode Dc1 is newly pulled out as a fourth external terminal 4. All others of switching module SM2 are the same as switching module SM1.

Figure 4:
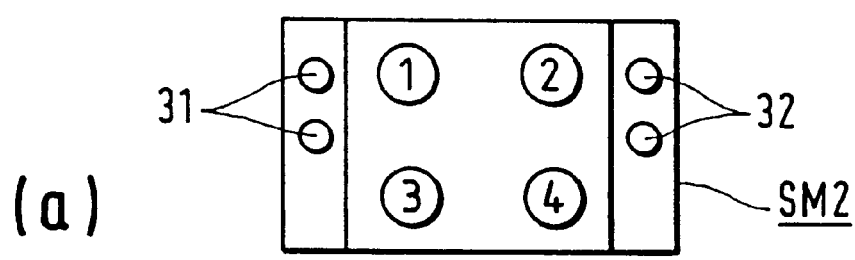
FIG. 4 is a diagram showing a construction of the switching module shown in FIG. 3, wherein (a) shows a plan view thereof and (b) shows a front view thereof.
Figure 4:
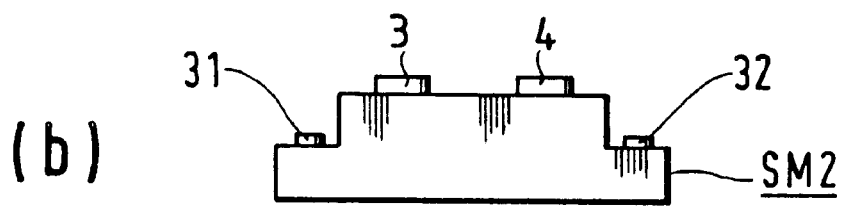

FIG. 4 illustrates an example of the configuration of switching module SM2. There are formed first through fourth external terminals 1–4 at the center of the top of switching module SM2 at nearly equal spaces, and gate signal terminals 31 and 32 at both ends of the top of switching module SM2.

A second embodiment has such action and effect that when composing a power converter, not only a 3-level power converter but also a 2-level power converter can be composed easily in addition to the action and effect of the first embodiment, by consolidating two self-turn-off devices S1, S2 and three diodes D1, D2, Dc1 into single switching module SM2 and particularly by providing fourth external terminal 4. In this case, fourth external terminal 4 becomes an output terminal in the 2-level power converter.

Figure 5:
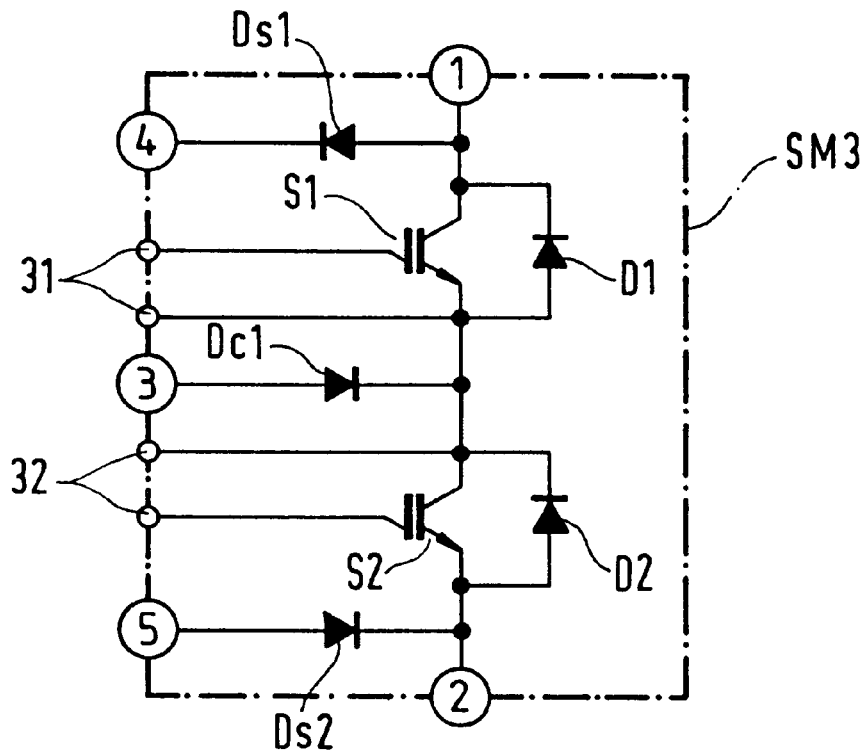
FIG. 5 is a diagram showing a configuration of a switching module according to a third embodiment of this invention.

FIG. 5 illustrates a configuration of a switching module SM3 according to a third embodiment of the present invention. When compared with switching module SM1 shown in FIGS. 1 and 2, this switching module SM3 features that a fourth diode Ds1 of which anode is connected to the positive side terminal, that is, the collector of self-turn-off device S1 and a fifth diode Ds2 of which cathode is connected to the negative side terminal, that is, the emitter of self-turn-off device S2 are additionally provided. Furthermore, the cathode of diode Ds1 is pulled out as a fourth external terminal 4 and the anode of diode Ds1 is pulled out as a fifth external terminal 5.

Figure 6:
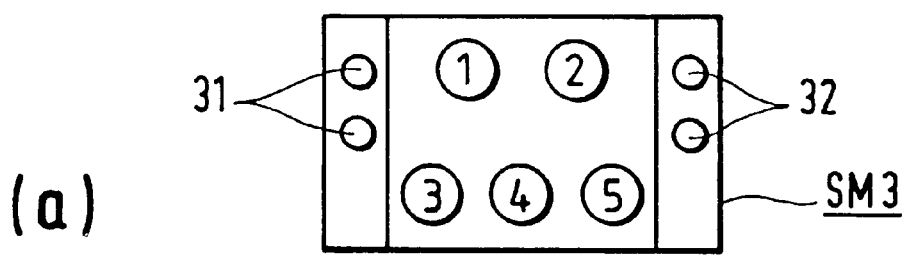
FIG. 6 is a diagram showing a construction of the switching module shown in FIG. 5, wherein (a) shows a plan view thereof and (b) shows a front view thereof.
Figure 6:
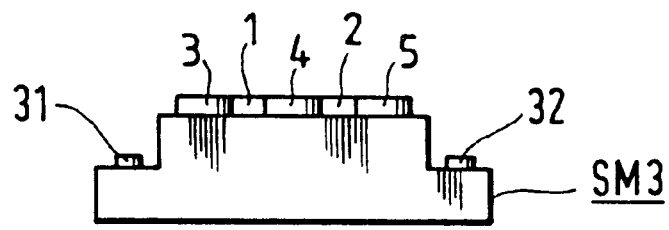

FIG. 6 shows an example of the configuration of switching module SM3. There are formed first through fifth external terminals 1–5 at the center of the top of switching module SM3 at nearly equal spaces, and gate signal terminals 31 and 32 at both ends of the top of switching module SM3.

It is possible to reduce line inductances in the circuit by consolidating two self-turn-off devices S1, S2 and five diodes D1, D2, Dc1, Ds1 and Ds2, for composing a power converter into single switching module SM3. Particularly, it is possible to make the wiring among third diode Dc1 which functions as a clamp diode and fourth and fifth diodes Ds1, Ds2 which function as snubber diodes and the connecting point of two self-turn-off devices S1, S2 extremely small, and downsize the entire circuit and further, compose a low-loss snubber circuit.

Figure 7:
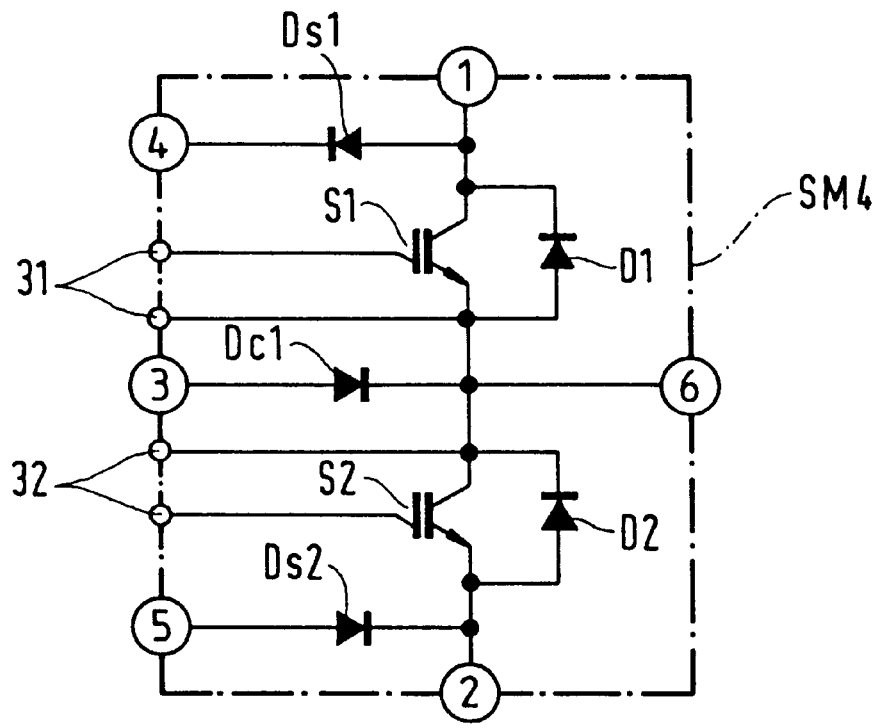
FIG. 7 is a diagram showing a configuration of a switching module according to a fourth embodiment of this invention.

FIG. 7 illustrates a configuration of a switching module SM4 according to a fourth embodiment of the present invention. When compared with switching module SM3 shown in FIGS. 5 and 6, this switching module SM4 features that the connecting point of self-turn-off devices S1, S2, that is, the cathode of diode Dc1 is pulled out as a sixth external terminal 6. All others of switching module SM4 are the same as switching module SM3.

Figure 8:
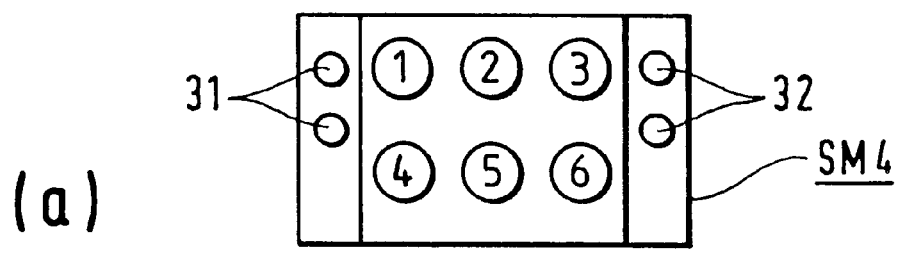
FIG. 8 is a diagram showing a construction of the switching module shown in FIG. 7, wherein (a) shows a plan view thereof and (b) shows a front view thereof.
Figure 8:
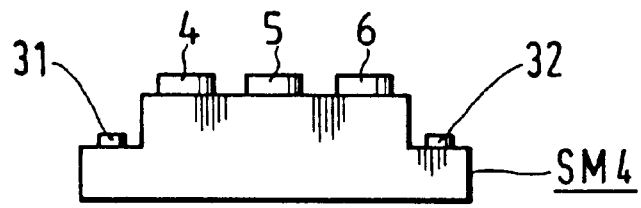

FIG. 8 shows an example of the configuration of switching module SM4. There are formed first through sixth external terminals 1–6 on the center of the top of switching module SM4 at nearly equal spaces, and gate signal terminals 31 and 32 at both ends of the top of switching module SM4.

When compared with switching module SM3 shown in FIGS. 5 and 6, switching module SM4 is provided especially with external terminal 6 and is able to easily compose not only a 3-level power converter but also a 2-level power converter when composing a power converter using switching modules SM4.

Figure 9:
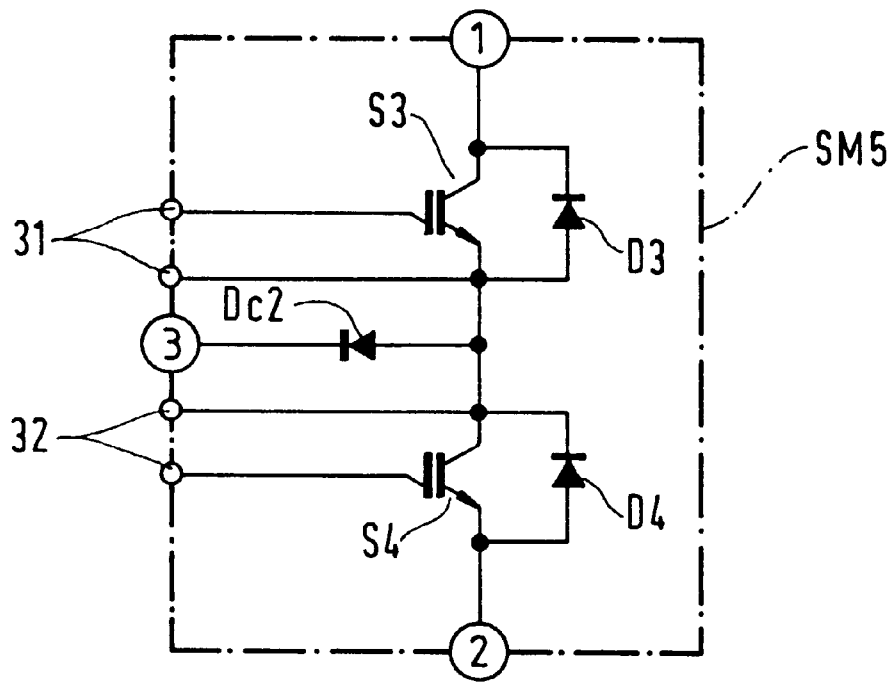
FIG. 9 is a diagram showing a configuration of a switching module according to a fifth embodiment of this invention.

FIG. 9 illustrates a configuration of a switching module SM5 according to a fifth embodiment of the present invention. This switching module SM5 is equivalent to switching module SM1 shown in FIGS. 1 and 2, which is equipped with diode Dc2 instead of diode Dc1 in the direction reverse to the polarity of diode Dc1. That is, switching module SM5 is composed of two series connected self-turn-off devices S3, S4, freewheeling diodes D3, D4 connected in antiparallel to self-turn-off devices S3, S4, respectively, and clamp diode Dc2 with its anode connected to the connecting point of two self-turn-off devices S3 and S4. In this switching module SM5, the collector, that is the positive side terminal, of self-turn-off device S3 is pulled out to the outside as a first external terminal 1, the emitter, that is the negative side terminal of self-turn-off device S4 is pulled out as a second external terminal 2, the cathode of clamp diode Dc2 is pulled out as a third external terminal 3, and further, gate signal terminals 31 and 32 of respective self-turn-off devices S3 and S4 are pulled out to the outside.

Figure 10:
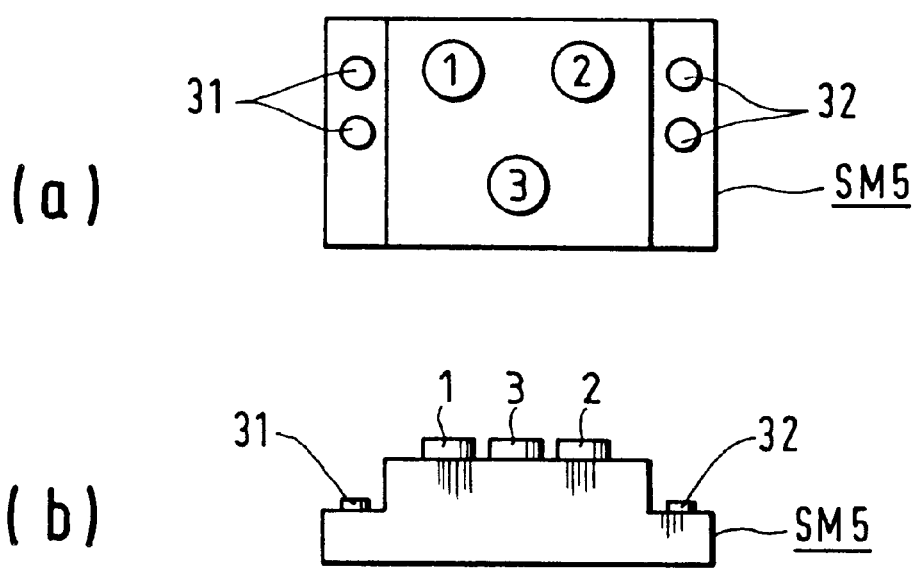
FIG. 10 is a diagram showing a construction of the switching module shown in FIG. 9, wherein (a) shows a plan view thereof and (b) shows a front view thereof.

FIG. 10 shows an example of the configuration of switching module SM5. There are formed first through third external terminals 1–3 at nearly equal spaces at the center of the top of switching module SM5 and gate signal terminals 31 and 32 at its lower tier ends of switching module SM5.

Further, switching module SM5 equipped with clamp diode Dc2 is used by connecting it to the negative side of a DC voltage source in a neutral point clamped power converter.

The action and effect of this embodiment are equal to those of the first embodiment shown in FIGS. 1 and 2.

Figure 11:
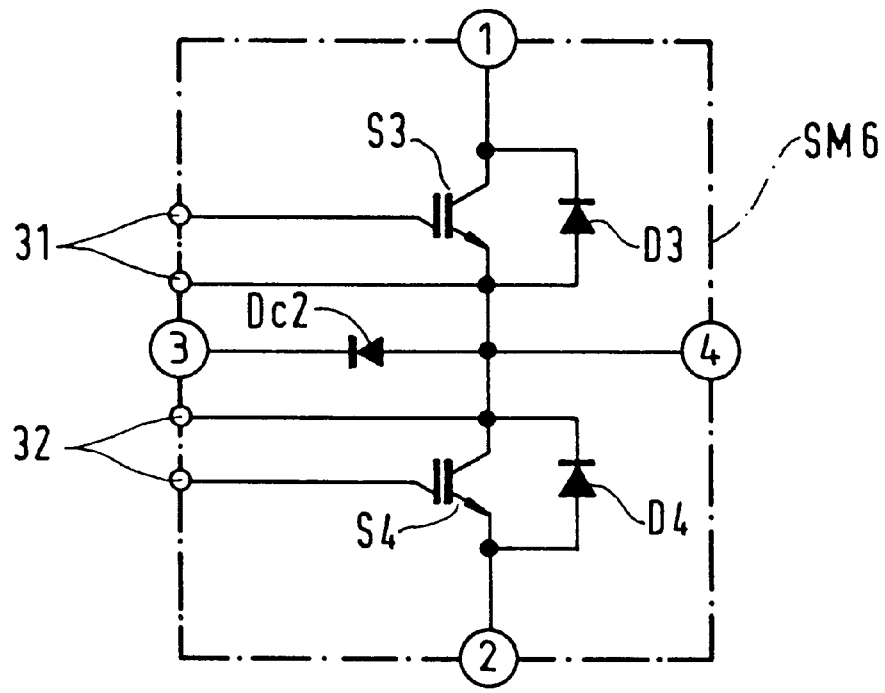
FIG. 11 is a diagram showing a configuration of a switching module according to a sixth embodiment of this invention.

FIG. 11 illustrates a configuration of a switching module SM6 according to a sixth embodiment of the present invention. When compared with switching module SM5 shown in FIGS. 9 and 10, switching module SM6 shown here features that the connecting point of two self-turn-off devices S3 and S4, that is the anode of diode Dc2 is newly pulled out as a fourth external terminal 4. All others of switching module SM6 are the same as those of switching module SM5.

Figure 12:
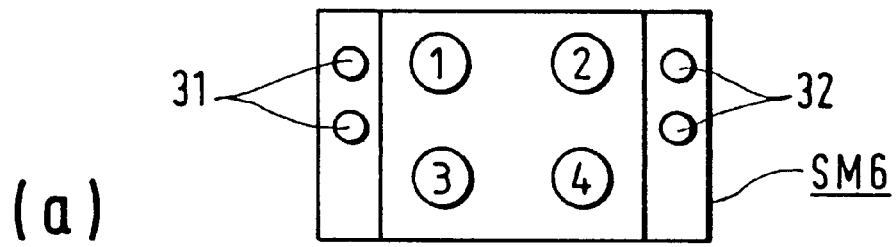
FIG. 12 is a diagram showing a construction of the switching module shown in FIG. 11, wherein (a) shows a plan view thereof and (b) shows a front view thereof.
Figure 12:
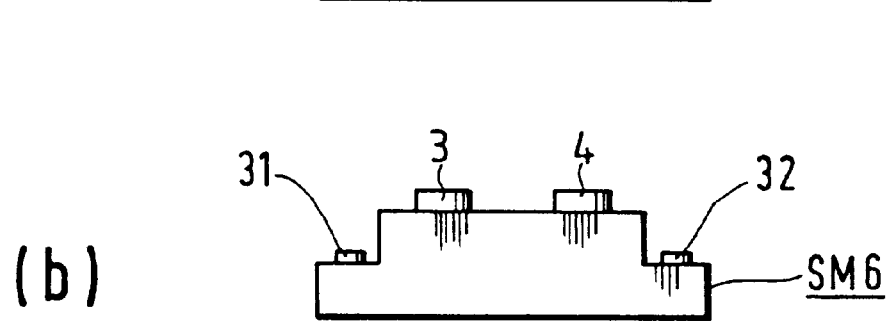

FIG. 12 shows an example of the configuration of switching module SM6. There are formed first through fourth external terminals 1–4 at the center of the top of switching module SM6 at nearly equal spaces, and gate signal terminals 31 and 32 at both ends of the top of switching module SM6.

The action and effect of this embodiment are equal to those of the second embodiment shown in FIGS. 3 and 4.

Figure 13:
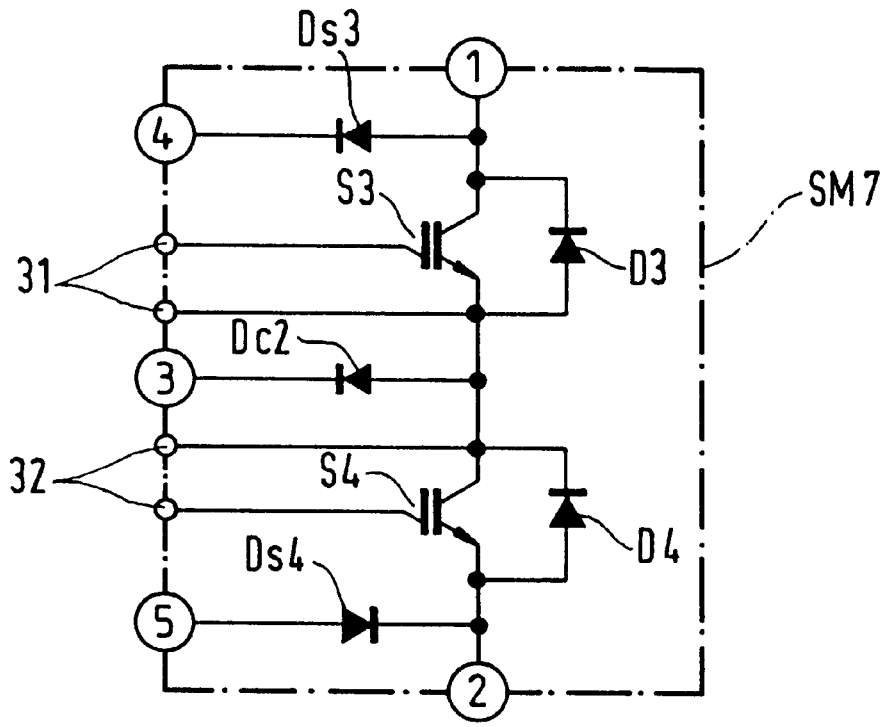
FIG. 13 is a diagram showing a configuration of a switching module according to a seventh embodiment of this invention.

FIG. 13 illustrates a configuration of a switching module SM7 according to a seventh embodiment of the present invention. When compared with switching module SM5 shown in FIGS. 9 and 10, this switching module SM7 features that a fourth diode Ds3 with its anode connected to the positive side terminal, that is, the collector of self-turn-off device S3 and a fifth diode Ds4 with its cathode connected to the negative side terminal, that is, the emitter of self-turn-off device S4 are additionally provided. Furthermore, the cathode of diode Ds3 is pulled out as fourth external terminal 4 and the anode of diode Ds4 is pulled out as a fifth external terminal 5.

Figure 14:
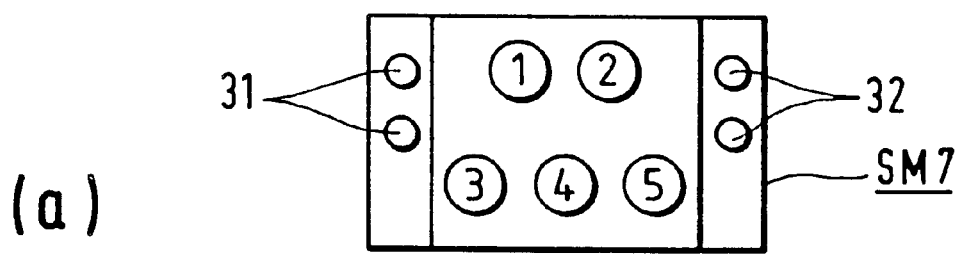
FIG. 14 is a diagram showing a construction of the switching module shown in FIG. 13, wherein (a) shows a plan view thereof and (b) shows a front view thereof.
Figure 14:
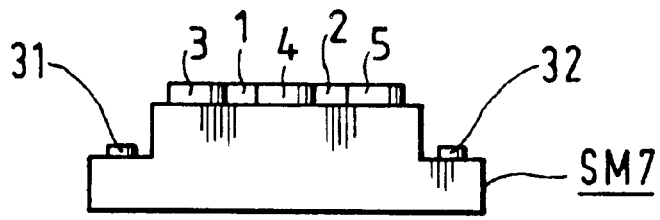

FIG. 14 shows an example of the configuration of switching module SM7. There are formed first through fifth external terminals 1–5 at the center of the top of switching module SM7 at nearly equal spaces, and gate signal terminals 31 and 32 at both ends of the top of switching module SM7.

The action and effect of this embodiment are equal to those of the third embodiment shown in FIGS. 5 and 6.

Figure 15:
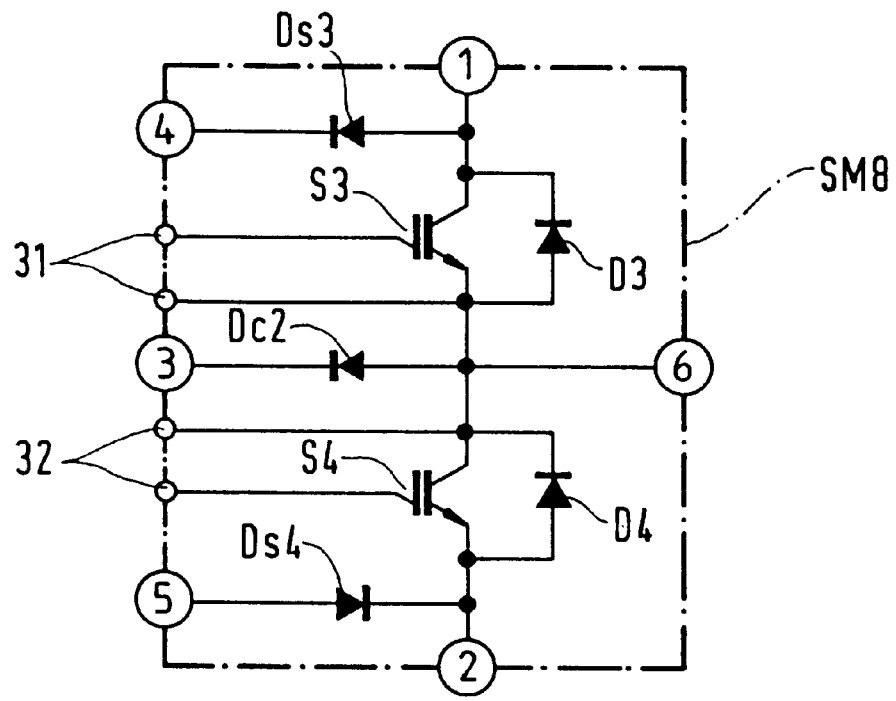
FIG. 15 is a diagram showing a configuration of a switching module according to an eighth embodiment of this invention.

FIG. 15 illustrates a configuration of a switching module SM8 according to an eighth embodiment of the present invention. When compared with switching module SM7 illustrated in FIGS. 13 and 14, this switching module SM8 features that the connecting point of self-turn-off devices S3, S4, that is the anode of diode Dc2 is pulled out as a sixth external terminal 6. All others of switching module SM8 are the same as switching module SM7.

Figure 16:
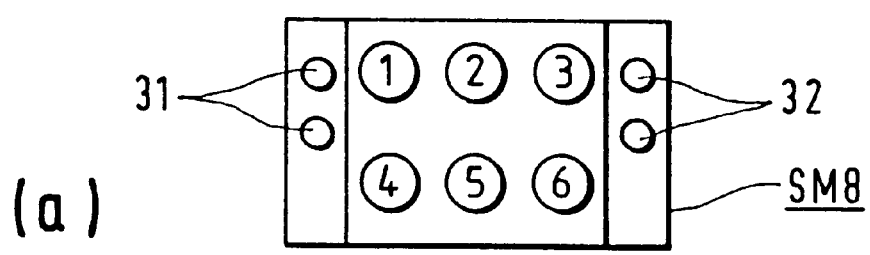
FIG. 16 is a diagram showing a construction of the switching module shown in FIG. 15, wherein (a) shows a plan view thereof and (b) shows a front view thereof.
Figure 16:
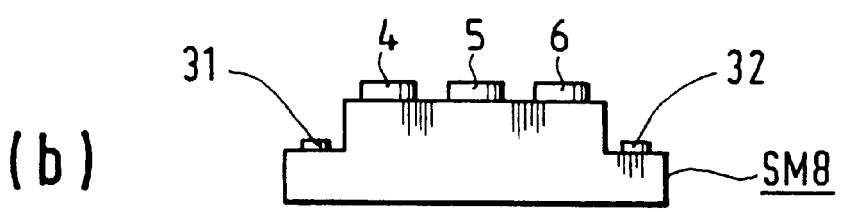

FIG. 16 shows an example of the configuration of switching module SM8. There are formed first through sixth external terminals 1–6 at the center of the top of switching module SM8 at nearly equal spaces, and gate signal terminals 31 and 32 at both ends of the top of switching module SM8.

The action and effect of this embodiment are equal to those of the fourth embodiment illustrated in FIGS. 7 and 8.

Hereinafter, a method for making switching modules SM1–SM8 is described, taking switching module SM3 for example.

Figure 5A:
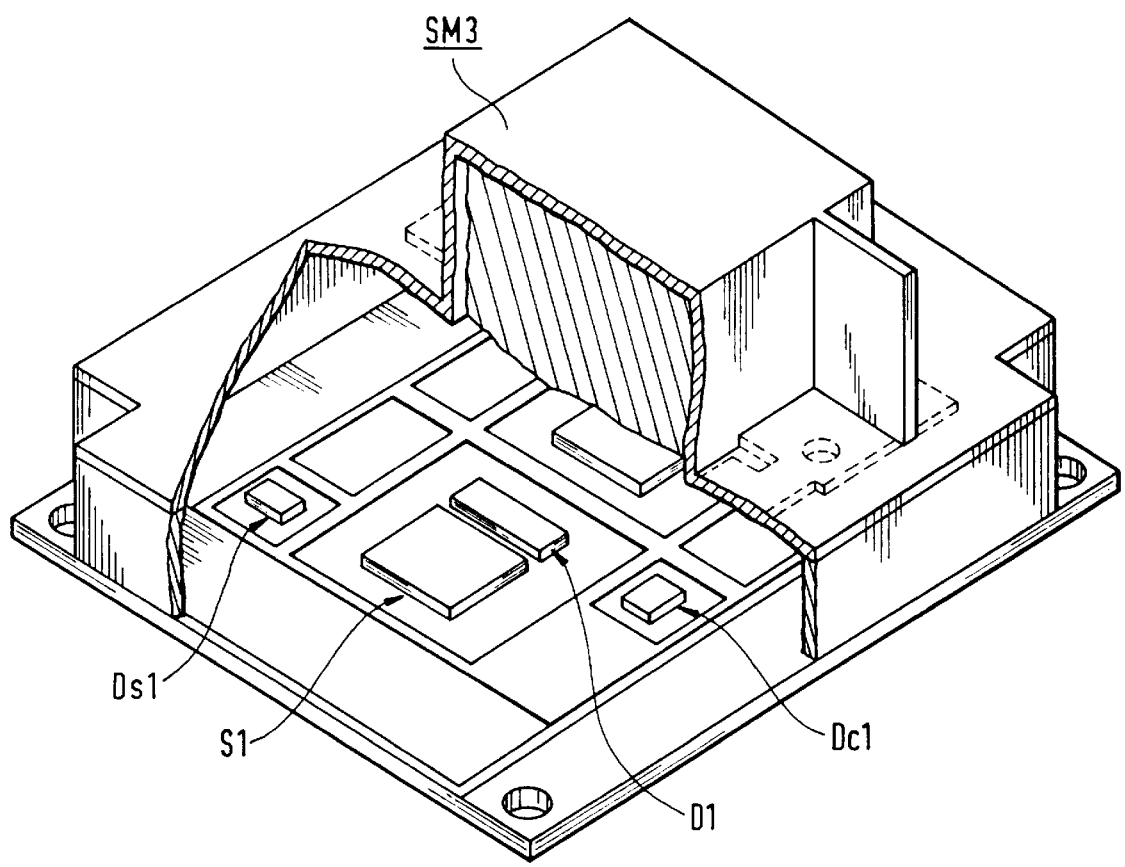
FIG. 5A is an exploded perspective view of switching module shown in FIG. 5.

FIG. 5A is an exploded perspective view of switching module SM3. Chips of self-turn-off device S1, self-turn-off device S2 (not shown), freewheeling diode D1, freewheeling diode D2 (not shown), snubber diode Ds1, snubber diode Ds2 (not shown), and clamp diode Dc1 are mounted on a substrate and wired to form switching module SM3 by a bare chip mounting method, which is also used for making conventional switching module SM0.

Other switching modules SM1, SM2, SM4–SM8 are also made by the bare chip mounting method by using chips necessary for the circuits of switching modules SM1, SM2, SM4–SM8, respectively. Accordingly, detailed description for making them is omitted.

Figure 17:
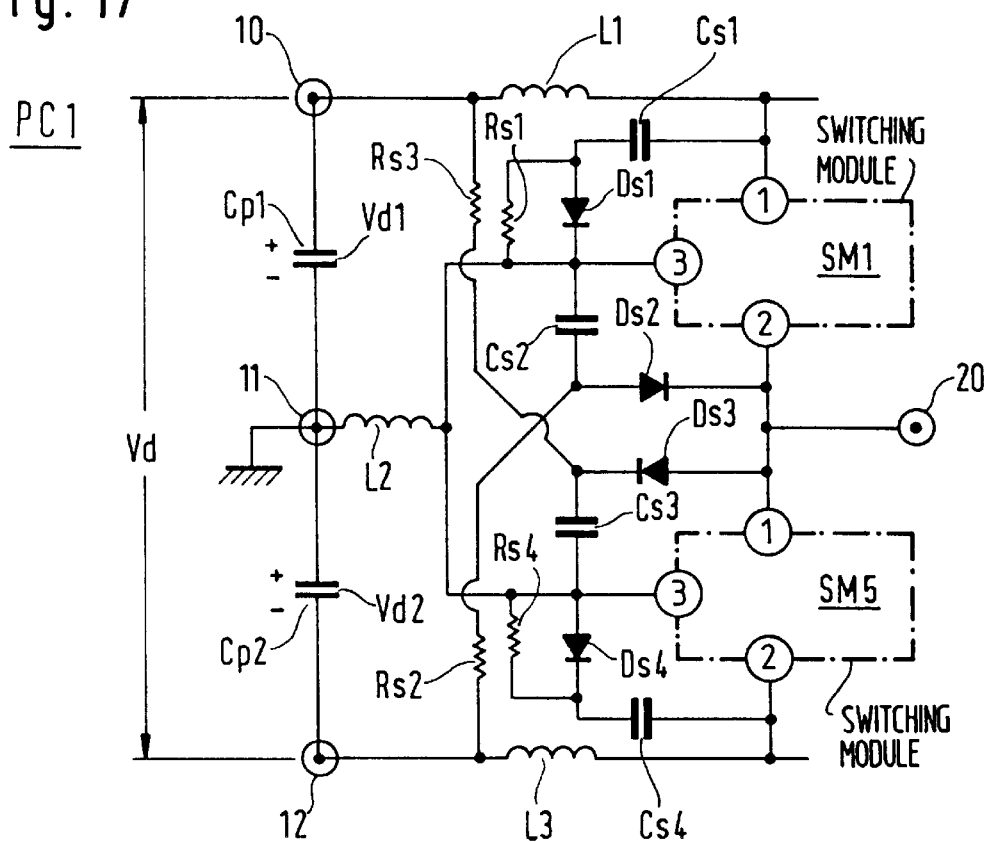
FIG. 17 is a circuit diagram showing an NPC inverter according to a ninth embodiment of this invention, equipped with low-loss snubber circuits.

FIG. 17 illustrates an NPC inverter according to a ninth embodiment of the present invention, equipped with low-loss snubber circuits. FIG. 17 shows a main circuit of the NPC inverter for a single phase (U-phase), and in case of a three-phase output inverter, the main circuit is composed for V-phase and W-phase the same as in U-phase.

A power converter (NPC inverter) PC1 shown in FIG. 17 is composed of by using switching module SM1 shown in FIGS. 1, 2 and switching module SM5 shown in FIGS. 9, 10 connected in series. Snubber circuits are respectively connected to switching modules SM1 and SM5. The snubber circuits are composed of snubber capacitors Cs1–Cs4, snubber diodes Ds1–Ds4 and snubber resistors Rs1–Rs4. Positive side terminal 10, zero-voltage terminal 11 and negative side terminal 12 are provided in DC voltage source (Voltage Vd). DC voltage source (voltage Vd=Vd1+Vd2) is illustrated as capacitors Cp1 and Cp2 with voltages Vd1 and Vd2 between positive side terminal 10 and zero-voltage terminal 11, and zero-voltage terminal 11 and negative side terminal 12. Positive and negative side terminals 10, 12 are respectively connected to both ends of series connected two switching modules SM1 and SM5, that is, external terminal 1 of switching module SM1 and external terminal 2 of switching module SM5. External terminal 2 of switching module SM1 and external terminal 1 of switching module SM5 are connected to output terminal 20. Further, external terminals 3 of both switching modules SM1 and SM5 are connected to zero-voltage terminal 11, respectively. Line inductances to DC power sources are shown by L1–L3, respectively.

The cathode of first snubber diode Ds1 is connected to third external terminal 3 of switching module SM1, and first snubber capacitor Cs1 is connected between the anode of first snubber diode Ds1 and first external terminal 1 of switching module SM1. First snubber resistor Rs1 is connected in parallel with first snubber diode Ds1. The cathode of second snubber diode Ds2 is connected to second external terminal 2 of switching module SM1, and second snubber capacitor Cs2 is connected between third external terminal 3 of switching module SM1 and the anode of second snubber diode Ds2. Second snubber resistor Rs2 is connected between the anode of second snubber diode Ds2 and negative side terminal 12 of the DC voltage source. The anode of third snubber diode Ds3 is connected to first external terminal 1 of switching module SM5, and third snubber capacitor Cs3 is connected between the cathode of third snubber diode Ds3 and third external terminal 3 of switching module SM5. Third snubber resistor Rs3 is connected between the cathode of third snubber diode Ds3 and positive side terminal 10 of the DC voltage source. The anode of fourth snubber diode Ds4 is connected to third external terminal 3 of switching module SM5, and fourth snubber capacitor Cs4 is connected between the cathode of fourth snubber diode Ds4 and second external terminal 2 of switching module SM5. Furthermore, fourth snubber resistor Rs4 is connected in parallel to fourth snubber diode Ds4.

Figure 30:
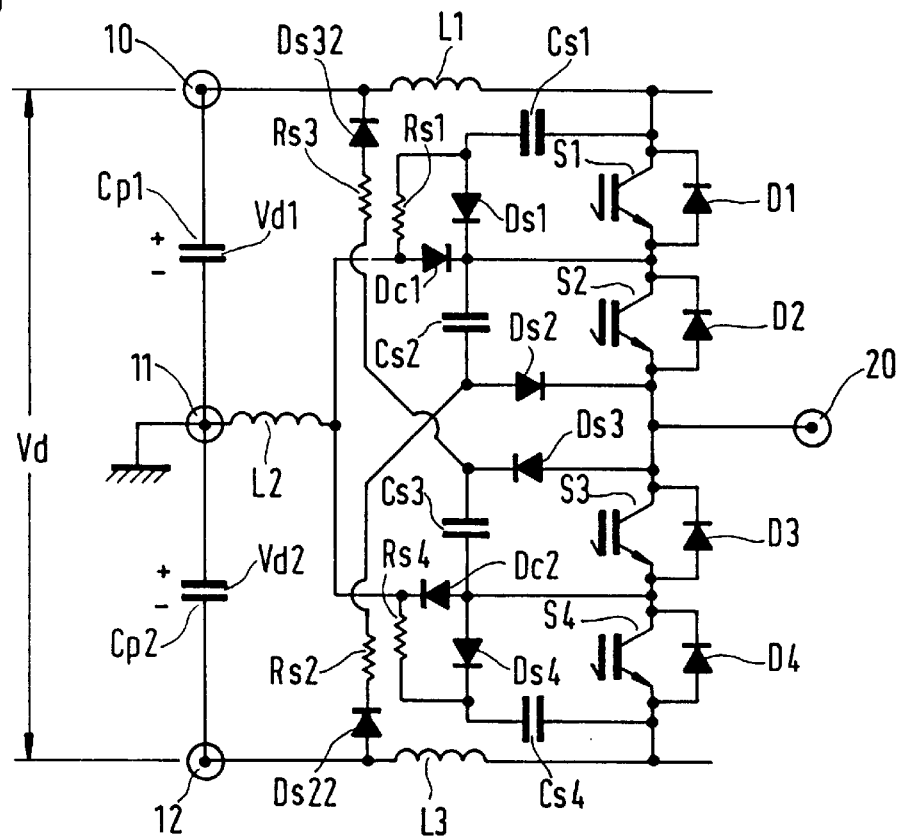
FIG. 30 is a circuit diagram showing one example of a conventional NPC inverter equipped with low-loss snubber circuits.

It is to be noted that the connecting points of clamp diode Dc1 in switching module SM1 and clamp diode Dc2 in switching module SM5 in NPC inverter PC1 shown in FIG. 17 are different from the connecting points of clamp diodes Dc1 and Dc2 of the conventional NPC inverter shown FIG. 30.

In FIG. 17, clamp diode Dc1 in switching module SM1 is connected between the connecting point of self-turn-off devices S1 and S2 and third external terminal 3 of switching module SM1, that is, zero-voltage terminal 11 of the DC voltage source (via line inductance L2). In FIG. 30, clamp diode Dc1 is connected between the connecting point of snubber diode Ds1 and snubber capacitor Cs2 and zero-voltage terminal 11 of the DC voltage source (via line inductance L2).

Furthermore, in FIG. 17, clamp diode Dc2 in switching module SM5 is connected between the connecting point of self-turn-off devices S3 and S4 and third external terminal 3 of switching module SM5, that is, zero-voltage terminal 11 of the DC voltage source (via line inductance L2). In FIG. 30, clamp diode Dc2 is connected between the connecting point of snubber diode Ds4 and snubber capacitor Cs3 and zero-voltage terminal 11 of the DC voltage source (via line inductance L2).

The action of this embodiment is the same as that of a tenth embodiment (FIG. 18) described later, which is composed without restriction by switching modules, and will be described in the section of the tenth embodiment.

Figure 31:
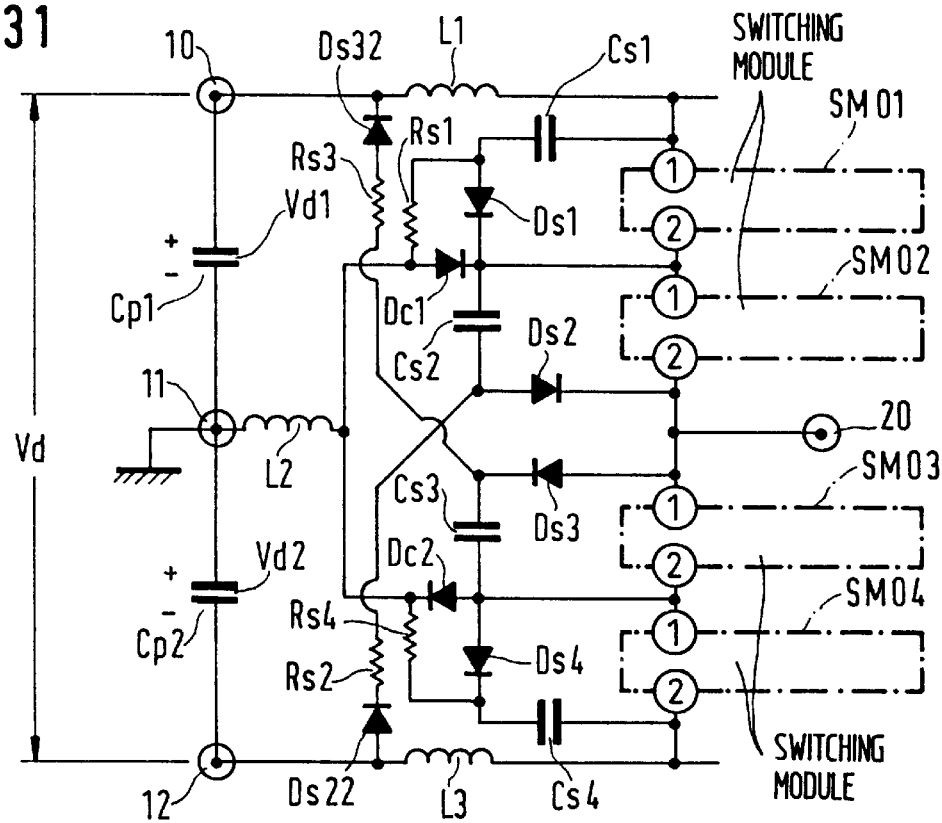
FIG. 31 is a circuit diagram showing one example of a conventional NPC inverter with the circuit construction shown in FIG. 30, composed of using the switching modules shown in FIG. 25.
Figure 32:
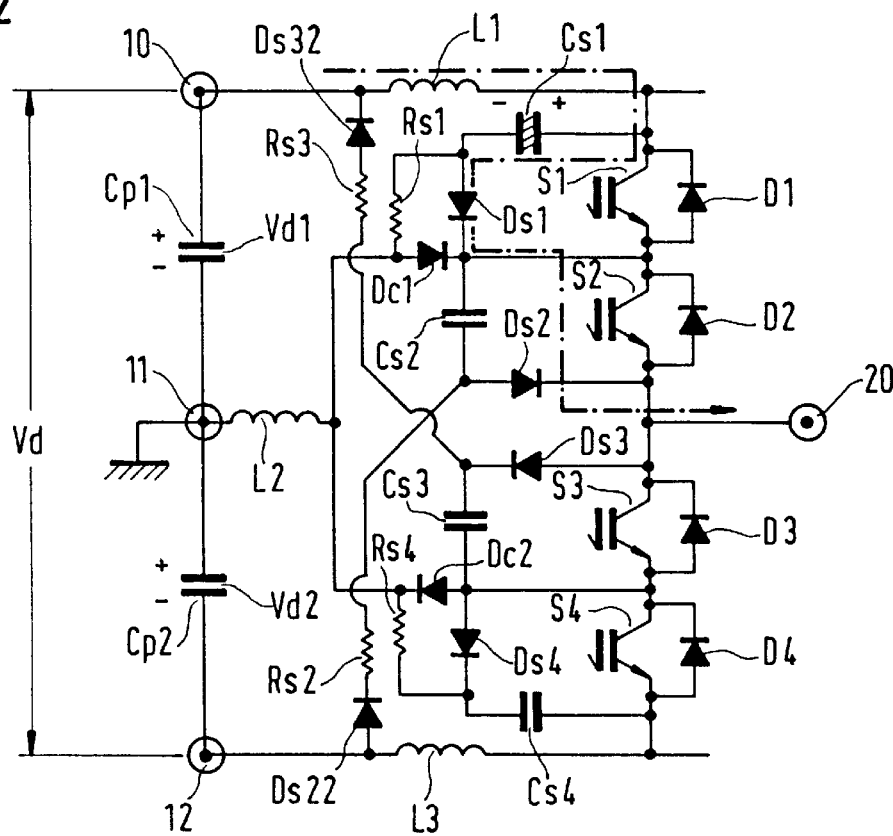
FIG. 32 is a diagram for explaining the charging operation of the snubber capacitor in the NPC inverter shown in FIG. 30.
Figure 33:
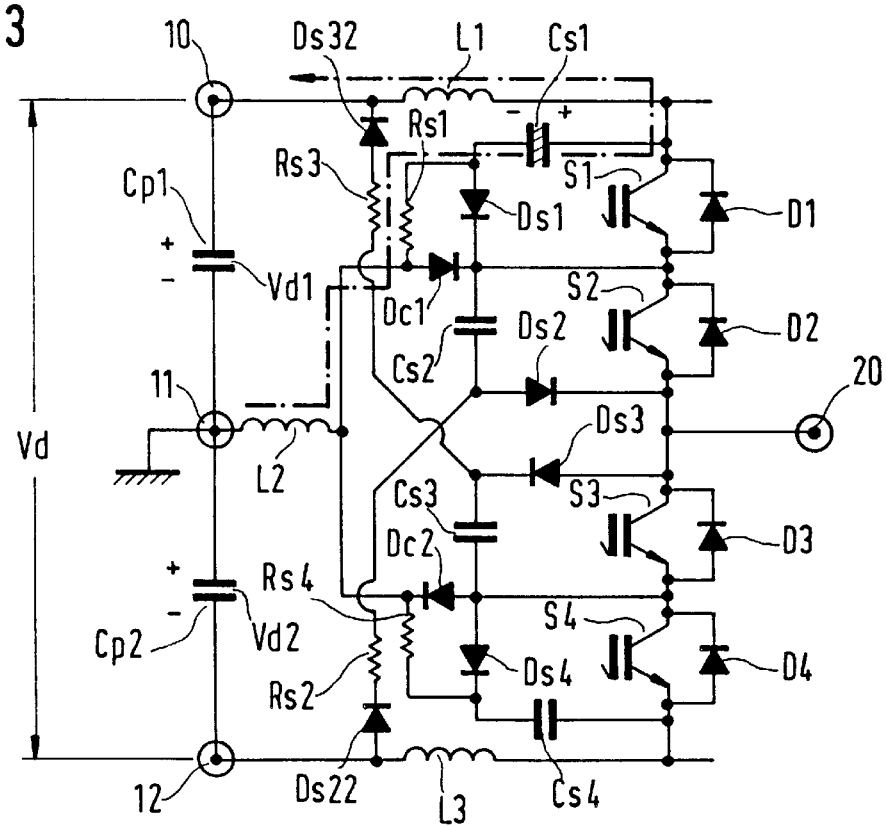
FIG. 33 is a diagram for explaining the discharging operation of the snubber capacitor in the NPC inverter shown in FIG. 30.
Figure 34:
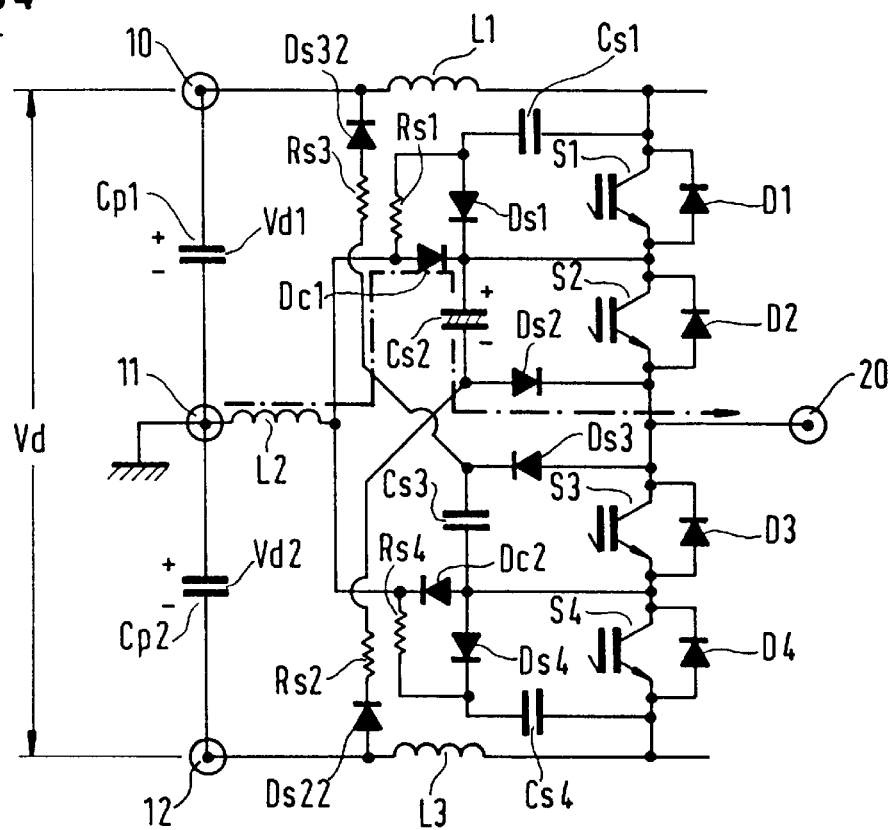
FIG. 34 is a diagram for explaining the charging operation of the snubber capacitor in the NPC inverter shown in FIG. 30.
Figure 35:
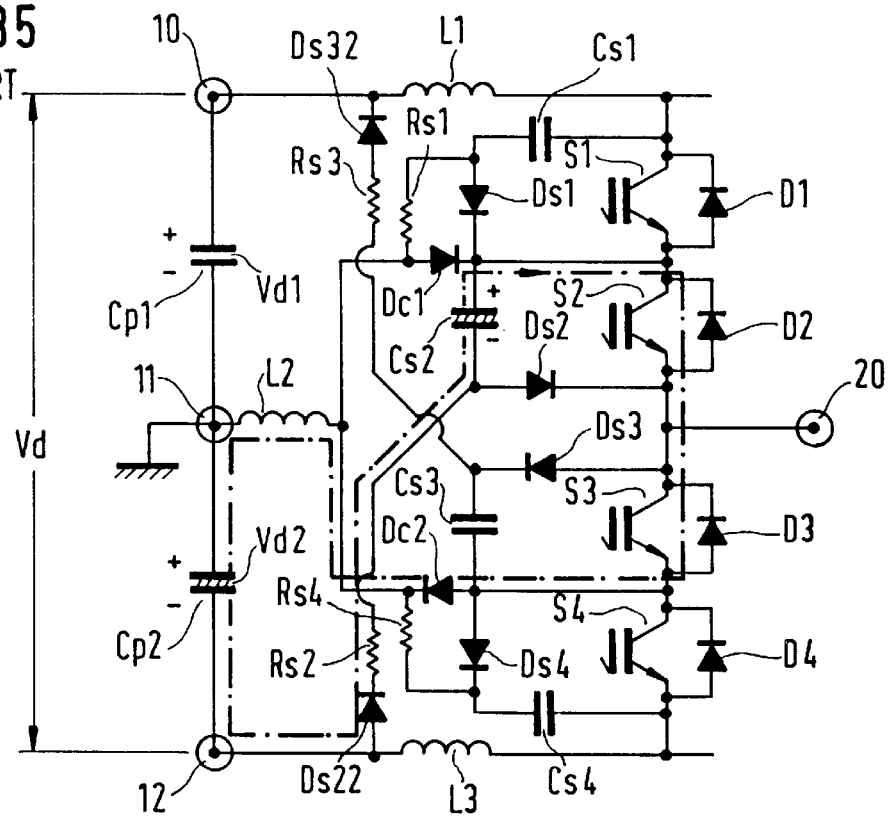
FIG. 35 is a diagram for explaining the discharging operation of the snubber capacitor in the NPC inverter shown in FIG. 30.

According to the embodiment illustrated in FIG. 17, it is possible to provide an NPC inverter equipped with low-loss snubber circuits, with line inductance reduced as the wiring length of the main circuit of the NPC inverter can be made short. Further, an NPC inverter PC1 according to the present invention has such a merit that the switching control of the self-turn-off devices is not restricted when compared with a conventional NPC inverter equipped with low-loss snubber circuits. Furthermore, it has a merit that external snubber diodes Ds22 and Ds32 (FIGS. 30 and 31) which are required in conventional low-loss snubber circuits are not required in this embodiment, and thus, the number of diodes can be reduced.

Figure 18:
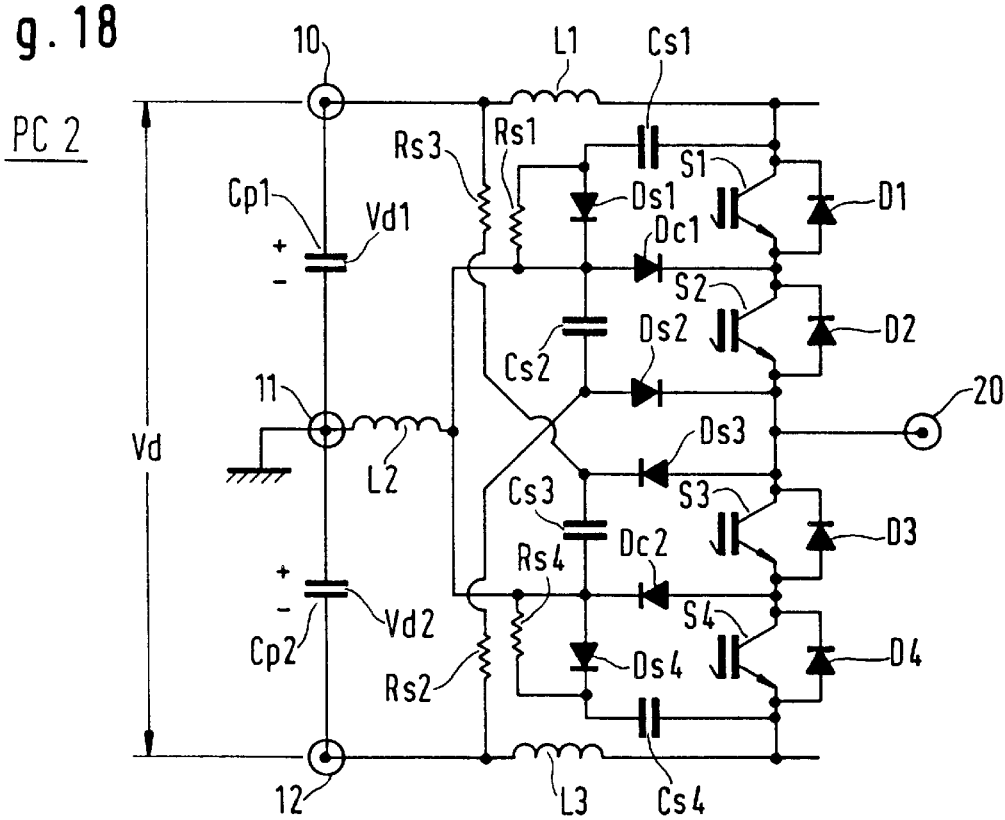
FIG. 18 is a circuit diagram showing an NPC inverter according to a tenth embodiment of this invention, equipped with low-loss snubber circuits.

FIG. 18 shows an NPC inverter PC2 according to a tenth embodiment of the present invention, equipped with low-loss snubber circuits. FIG. 18 shows a main circuit of the NPC inverter for a single phase (U-phase), and in case of a three-phase output inverter, the main circuits for V-phase and W-phase are composed of in the same manner as for U-phase.

This embodiment differs from the embodiment shown in FIG. 17 in that the circuit is composed of individual component parts without using switching modules. That is, in NPC inverter PC2 shown in FIG. 18, switching module SM1 is replaced by individual self-turn-off devices S1, S2, freewheeling diodes D1, D2 and clamp diode Dc1. Similarly, switching module SM5 is replaced by individual self-turn-off devices S3, S4, freewheeling diodes D3, D4 and clamp diode Dc2. Therefore, the circuit configuration shown in FIG. 18 is substantially equivalent to that of the circuit shown in FIG. 17.

An example of the relationship between the switching operation of the self-turn-off devices S1–S4 and voltage levels in NPC inverter PC2 is shown below. When self-turn-off devices S1 and S2 are ON, voltage Vd1 is output, when self-turn-off devices S2 and S3 are ON, zero-voltage is output, and when self-turn-off devices S3 and S4 are ON, voltage −Vd2 is output. For making the explanation simple, voltages are assumed to be Vd1=Vd2=Vd/2 here.

In the NPC inverter, for instance, when self-turn-off devices S1–S3 are turned ON simultaneously, DC voltage Vd1 is short-circuited in the route of self-turn-off devices S1→S2→S3→clamp diode Dc2, and as a result, excessive short-circuit current flows to self-turn-off devices S1, S2 and S3. To prevent this short-circuit current, self-turn-off devices S1 and S3, and self-turn-off devices S2 and S4 are reversely operated, respectively.

Figure 19:
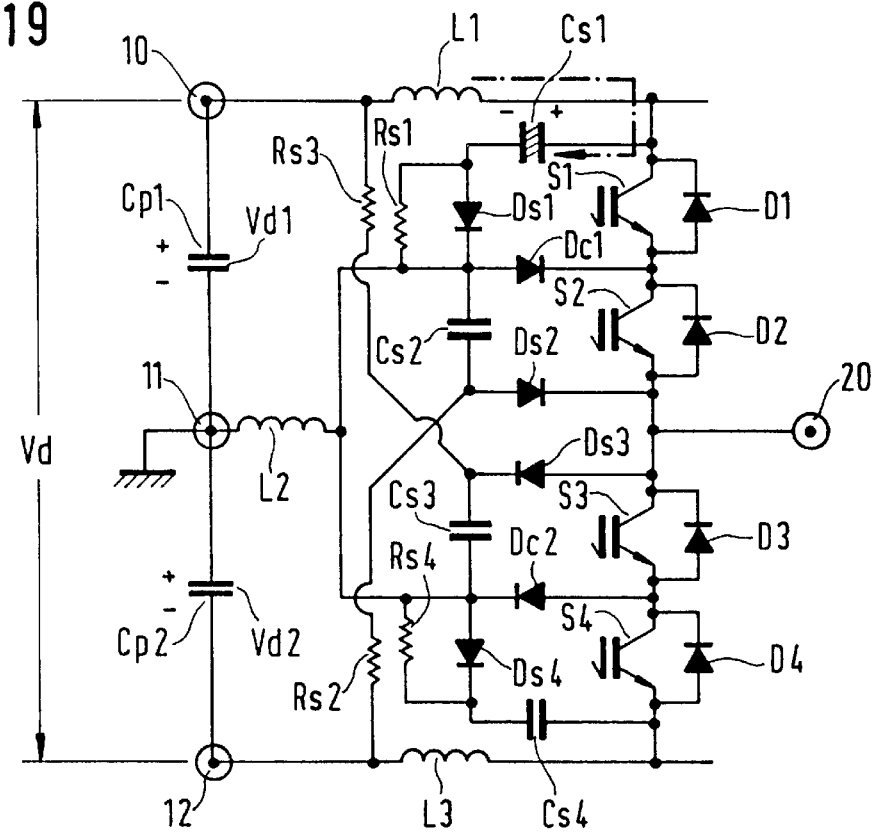
FIG. 19 is a diagram for explaining the charging operation of the snubber capacitor in the NPC inverter shown in FIG. 18.

When assuming the state wherein current is flowing through line inductance L1 and self-turn-off devices S1 and S2, the voltage of snubber capacitor Cs1 is Vd1 and snubber capacitor Cs1 is in the already charged state. At this time, when self-turn-off device S1 is turned OFF, the voltage of self-turn-off device S1 rises by the residual energy of line inductance L1. When this voltage exceeds the voltage of snubber capacitor Cs1, forward voltage is applied to snubber diode Ds1, which is then put in the ON state. As a result, the residual energy of line inductance L1 flows in and is absorbed by snubber capacitor Cs1 as shown in FIG. 19.

Figure 20:
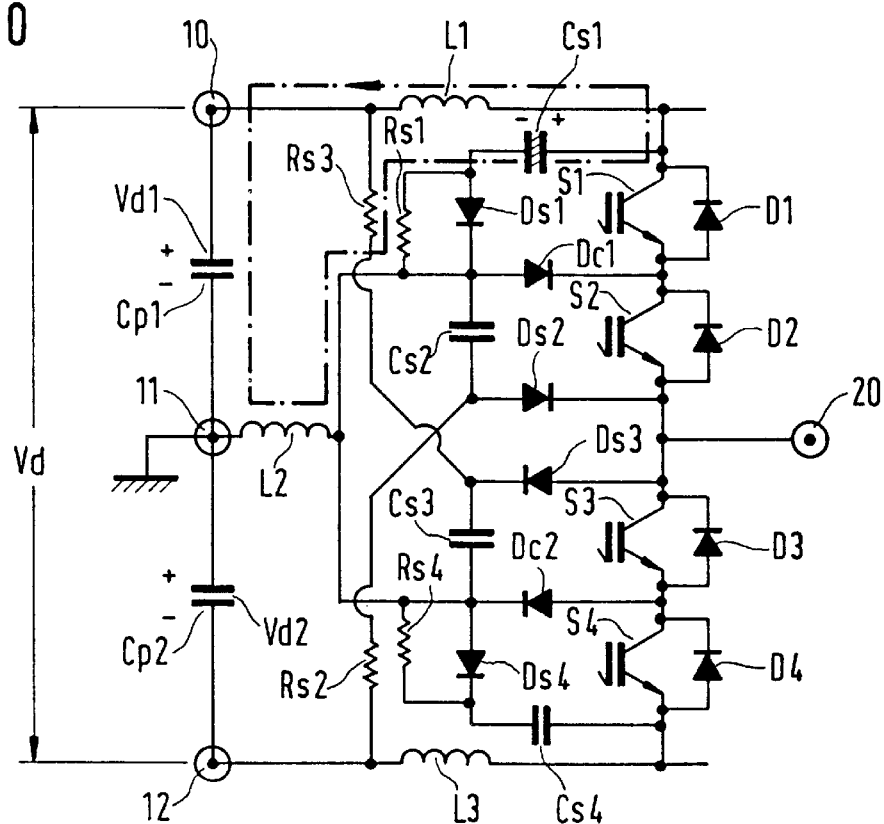
FIG. 20 is a diagram for explaining the discharging operation of the snubber capacitor and the snubber resistor in the NPC inverter shown in FIG. 18.

Even if the voltage of snubber capacitor Cs1 rises, it is kept clamped at DC voltage Vd1 and therefore, excess voltage is discharged by snubber resistor Rs1 so that the voltage of snubber capacitor Cs1 becomes equal to voltage Vd1. The route of discharging current is Cs1→L1→Cp1→L2→Rs1→Cs1 as shown in FIG. 20. Because the voltage of self-turn-off device S1 is kept clamped at the voltage of snubber capacitor Cs1, the voltage of self-turn-off device S1 can be kept nearly at voltage Vd1. Even when self-turn-off device S1 is turned ON again, snubber capacitor Cs1 does not discharge and maintains voltage Vd1. The loss consumed by snubber resistor Rs1 is only excess voltage charged in snubber capacitor Cs1. Accordingly, in this embodiment, the loss can be reduced sharply more than a conventional discharge type snubber circuit.

The operation of self-turn-off device S2 and the action of its snubber circuit are the same as those of self-turn-off device S1. When assuming the state wherein current is flowing through line inductance L2, clamp diode Dc1 and self-turn-off devices S2 and S3, the voltage of snubber capacitor Cs2 is Vd2 and snubber capacitor Cs2 is in the already charged state. When self-turn-off device S2 is turned OFF, the voltage of self-turn-off device S2 is raised by the residual energy of line inductance L2. When the voltage of self-turn-off device S2 exceeds the voltage of snubber capacitor Cs2, forward voltage is applied to snubber diode Ds2, which is then put in the ON state. As a result, the residual energy of line inductance L2 flows in and is absorbed by snubber capacitor Cs2. At this time, the voltage of snubber capacitor Cs2 rises, but it is kept clamped at voltage −Vd2, and therefore, excess voltage is discharged by snubber resistor Rs2 so that the voltage of snubber capacitor Cs2 becomes equal to voltage −Vd2. Even when self-turn-off device S2 is turned ON again, snubber capacitor Cs2 does not discharge and maintains voltage −Vd2. Because of this, the loss consumed by snubber resistor Rs2 is only excess voltage charged in snubber capacitor Cs2, and the voltage loss can be sharply reduced more than a conventional discharge type snubber circuit. Further, when compared with a conventional low-loss snubber circuit, in a conventional low-loss snubber circuit, to discharge excess voltage charged in snubber capacitor Cs2, self-turn-off device S2 must be turned ON again and self-turn-off device S3 also must be in the ON state. However, in the low-loss snubber circuit of NPC inverter PC2 according to the present invention, the voltages of snubber capacitor Cs2 and self-turn-off device S2 become steadily equal to DC voltage −Vd2 regardless of the operating state of the self-turn-off device S2.

The actions of the snubber circuits for self-turn-off devices S3, S4 are also the same as those for self-turn-off devices S1, S2.

According to this embodiment, for instance, the control system disclosed in the Japanese Patent Disclosure (Kokai) No. Hei 4-295279 is also applicable to this embodiment. According to this control system, it is possible to reduce loss by eliminating the useless switching operation by turning only the self-turn-off devices ON which are required according to the direction of the output current. For instance, when the output current is positive, self-turn-off devices S3 and S4 are fixed at the OFF state. Further, when the output current is negative, self-turn-off devices S1 and S2 are kept in the OFF state. Thus, it becomes possible to eliminate useless switching and reduce the switching loss.

Now, the NPC inverter according to this invention applied with this control system is compared with an NPC inverter equipped with a conventional low-loss snubber circuit applied with this control system. It is assumed that self-turn-off device S2 is turned ON/OFF in the state wherein the output current is positive and self-turn-off devices S3 and S4 are in the OFF state. In order to discharge excess voltage charged in snubber capacitor Cs2 in a conventional low-loss snubber circuit, no excess voltage is discharged unless self-turn-off device S2 is turned ON again and self-turn-off device S3 is also in the ON state. On the other hand, in the low-loss snubber circuit in the NPC inverter according to this invention, it is possible to discharge excess voltage of snubber capacitor Cs2 regardless of the operating state of self-turn-off device S2 and thereby to maintain the voltage of snubber capacitor Cs2 and that of self-turn-off device S2 steadily at an equal level to DC voltage −Vd2.

Snubber diodes Ds22 and Ds32 which are required in the conventional low-loss snubber circuits (FIGS. 30 and 31) are no longer required in the low-loss snubber circuits of NPC inverter PC2 according to the present invention.

It is assumed that, for instance, self-turn-off devices S1 and S2 are in the ON state.

In the circuit shown in FIG. 30, when self-turn-off devices S3 and S2 are in the ON state, the potential at the positive side terminal of snubber capacitor Cs2 becomes equal to the potential at positive side terminal 10 of DC voltage source as self-turn-off device S1 is in the ON state. When assuming that there is no snubber diode Ds22, a current flows through a series circuit of positive side terminal 10 of DC voltage source, snubber capacitor Cs2, snubber resistor Rs2 and negative side terminal 12 of DC voltage source. As a result, a current continues to flow through snubber resistor Rs2 thereby to increase loss by snubber resistor Rs2. To prevent this state, snubber diode Ds22 is connected as shown in FIG. 30 to prevent this current from flowing through snubber resistor Rs2.

In the circuit shown in FIG. 18, when self-turn-off devices S1 and S2 are in the ON state, the potential at the positive side terminal of snubber capacitor Cs2 becomes equal to the potential at zero-voltage terminal 11 of DC voltage source, and the potential at the negative side terminal of snubber capacitor Cs2 becomes nearly equal to the potential at negative side terminal 12 of DC voltage source. That is, even when self-turn-off device S1 is in the ON state, clamp diode Dc1 is connected between the negative side terminal of self-turn-off device S1 and the positive side terminal of snubber capacitor Cs2 in the direction as shown in FIG. 18, a current does not flow through snubber capacitor Cs2. As a result, it does not occur that total voltage Vd of the DC voltage source is applied to snubber capacitor Cs2.

For the above-described action, in the low-loss snubber circuit of the NPC inverter according to the present invention, it does not occur that the total voltage of the DC voltage source is applied to snubber capacitor Cs2 or Cs3, which is a problem in a conventional low-loss snubber circuit.

According to the embodiment shown in FIG. 18, it is possible to provide an NPC inverter equipped with low-loss snubber circuits. Further, when compared with an NPC inverter equipped with conventional low-loss snubber circuits, the NPC inverter according to the present invention has a merit that the switching control of the self-turn-off devices is not restricted. Furthermore, the NPC inverter according to the present invention has another merit that the external snubber diodes Ds22 and Ds32 which are required in conventional low-loss snubber circuits are not required, and thus, the number of diodes can be reduced.

Figure 21:
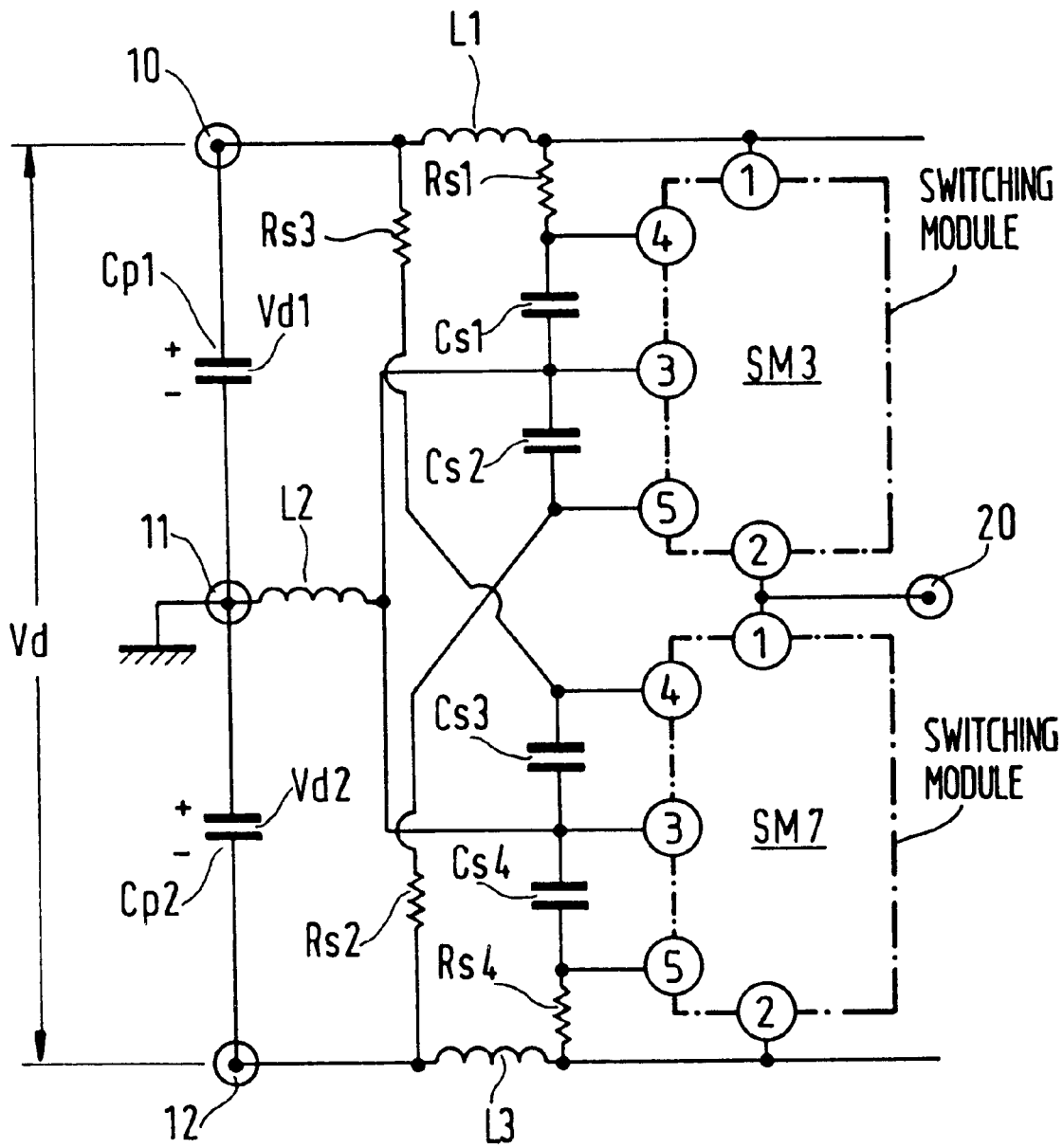
FIG. 21 is a circuit diagram showing an NPC inverter according to an eleventh embodiment of this invention, equipped with low-loss snubber circuits.

FIG. 21 shows an NPC inverter according to an eleventh embodiment of the present invention, equipped with low-loss snubber circuits. FIG. 21 shows a main circuit of the NPC inverter for a single phase (U-phase), and in case of a three-phase output inverter, the main circuits for V-phase and W-phase are also composed of in the same manner.

An NPC inverter PC3 shown in FIG. 21 is composed of switching module SM3 shown in FIGS. 5 and 6 and switching module SM7 shown in FIGS. 13 and 14 connected in series. Snubber circuits differing from those shown in FIG. 17 are connected to switching modules SM3 and SM7. External snubber circuits are composed of snubber capacitors Cs1–Cs4 and snubber resistors Rs1–Rs4. Here, snubber diodes Ds1-Ds4 are built in switching modules SM3, SM7 and no snubber diodes are used outside switching modules SM3, SM7. Positive side terminal 10, zero-voltage terminal 11 and negative side terminal 12 are provided in the DC voltage source (voltage Vd). Capacitors Cp1 and Cp2 are connected between positive side terminal 10 and zero-voltage terminal 11, and between zero-voltage terminal 11 and negative side terminal 12, respectively, and the voltages of capacitors Cp1 and Cp2 are shown by Vd1 and Vd2, respectively. Positive and negative side terminals 10 and 12 are respectively connected to both ends of series connected two switching modules SM3 and SM7, that is, external terminal 1 of switching module SM3 and external terminal 2 of switching module SM7. External terminal 2 of switching module SM3 and external terminal 1 of switching module SM7 are connected to output terminal 20. Further, external terminals 3 of both switching modules SM3 and SM7 are connected to zero-voltage terminal 11, respectively. Line inductances to DC voltage source are shown by L1–L3, respectively.

First snubber resistor Rs1 is connected between first and fourth external terminals 1 and 4 of switching module SM3. First snubber capacitor Cs1 is connected between third and fourth external terminals 3 and 4, and second snubber capacitor Cs2 is connected between third and fifth external terminals 3 and 5. Second snubber resistor Rs2 is connected between fifth external terminal 5 of switching module SM3 and negative side terminal 12 of the DC voltage source. Similarly, third snubber resistor Rs3 is connected between fourth external terminal 4 of switching module SM7 and positive side terminal 10 of the DC voltage source, and third snubber capacitor Cs3 is connected between third and fourth external terminals 3 and 4 of switching module SM7. Fourth snubber capacitor Cs4 is connected between third and fifth external terminals 3 and 5, and fourth snubber resistor Rs4 is connected between second and fifth external terminals 2 and 5 of switching module SM7.

It is to be noted that the connecting points of clamp diode Dc1 in switching module SM3 and clamp diode Dc2 in switching module SM7 in NPC inverter PC3 shown in FIG. 21 are different from the connecting points of clamp diodes Dc1 and Dc2 of the conventional NPC inverter shown FIG. 30.

In FIG. 21, clamp diodes Dc1 and Dc2 are connected substantially at the same positions as in NPC inverter PC1 shown in FIG. 17. That is, clamp diode Dc1 in switching module SM3 is connected between the connecting point of self-turn-off devices S1 and S2 and third external terminal 3 of switching module SM3, that is, zero-voltage terminal 11 of the DC voltage source (via line inductance L2). Furthermore, clamp diode Dc2 in switching module SM7 is connected between the connecting point of self-turn-off devices S3 and S4 and third external terminal 3 of switching module SM7, that is, zero-voltage terminal 11 of the DC voltage source (via line inductance L2).

The action of this embodiment is the same as that of a twelfth embodiment (FIG. 22) described later, which is composed without restriction by switching modules, and will be described in the section for the twelfth embodiment.

According to the embodiment shown in FIG. 21, it is possible to provide an NPC inverter equipped with low-loss snubber circuits, with line inductance reduced by making the wiring length of the main circuit of the NPC inverter short. Further, when compared with an NPC inverter equipped with conventional low-loss snubber circuits, the NPC inverter according to this invention has a merit that the switching control of self-turn-off devices is not restricted and furthermore, has another merit that external snubber diodes Ds22 and Ds32 which are required in conventional low-loss snubber circuits are not required in this embodiment, and thus, the number of diodes can be reduced.

Figure 22:
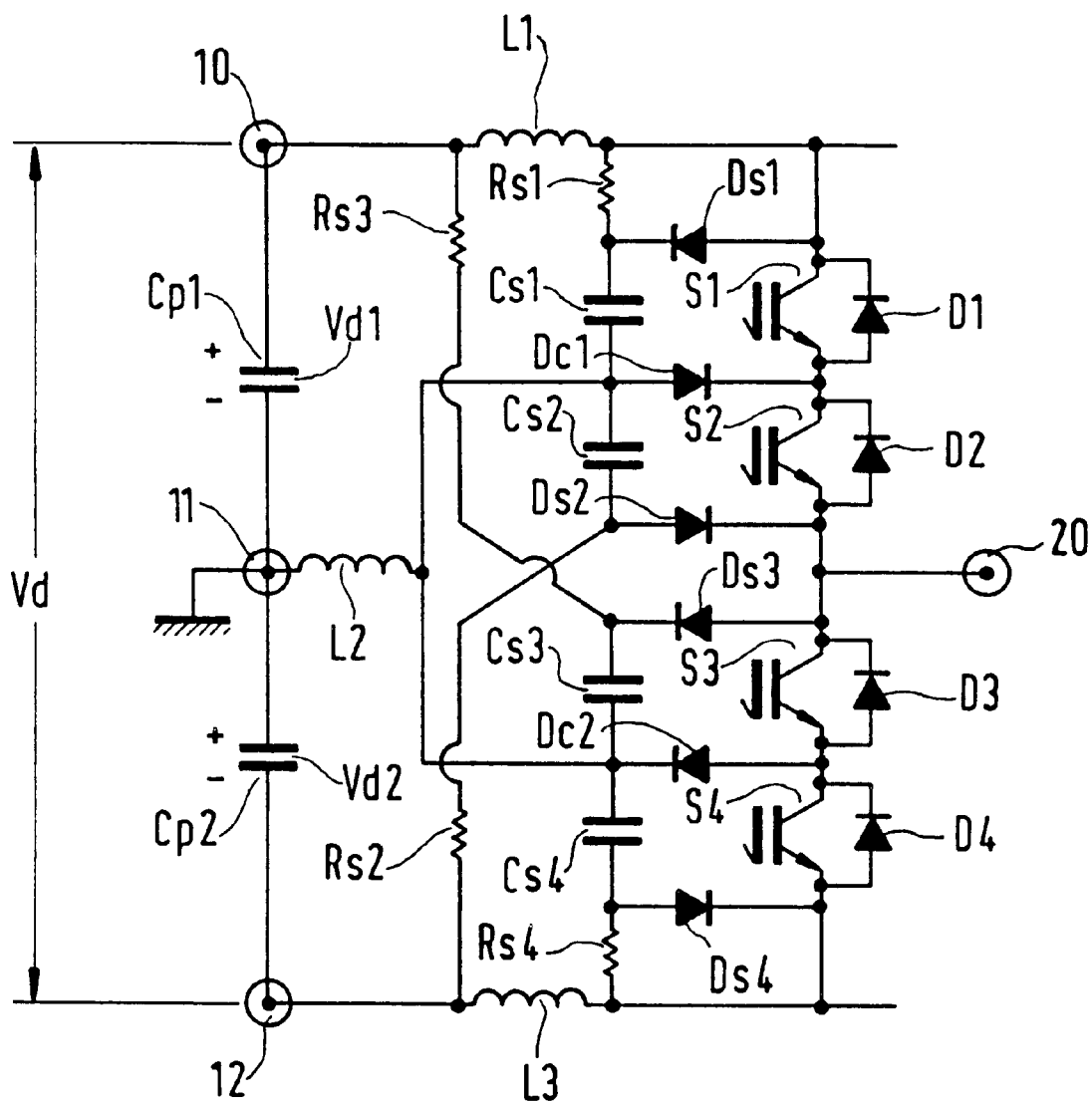
FIG. 22 is a circuit diagram showing an NPC inverter according to a twelfth embodiment of this invention, equipped with low-loss snubber circuits.

FIG. 22 shows an NPC inverter PC4 according to a twelfth embodiment of the present invention, equipped with low-loss snubber circuits. FIG. 22 shows a main circuit of the NPC inverter for a single phase (U-phase), and in case of a three-phase output inverter, the main circuits for V-phase and W-phase are composed of in the same manner as for U-phase.

This embodiment differs from the embodiment shown in FIG. 21 in that the circuit is composed of individual component parts without using switching modules. That is, in NPC inverter PC4 shown in FIG. 22, switching module SM3 shown in FIG. 21 is replaced by individual self-turn-off devices S1, S2, freewheeling diodes D1, D2, clamp diode Dc1 and snubber diodes Ds1, Ds2. Similarly, switching module SM5 is replaced by individual self-turn-off devices S3, S4, freewheeling diodes D3, D4, clamp diode Dc2 and snubber diodes Ds3, Ds4. Therefore, the circuit configuration in FIG. 22 is substantially equivalent to the circuit shown in FIG. 21.

One example of the relationship between the switching operation of the self-turn-off devices and voltage levels in WPC inverter PC4 shown in FIG. 22 is shown in the following. When self-turn-off devices S1 and S2 are ON, voltage Vd1 is output, when self-turn-off devices S2 and S3 are ON, zero-voltage is output, and when self-turn-off devices S3 and S4 are ON, voltage −Vd2 is output. For making the description simple, voltages are assumed to be Vd1=Vd2=Vd/2 here.

In the NPC inverter, for instance, when self-turn-off devices S1–S3 are turned ON simultaneously, as described above DC voltage Vd1 is short-circuited in the route of self-turn-off devices S1→S2→S3→clamp diode Dc2, and as a result, excessive short-current flows through self-turn-off devices S1, S2 and S3. To prevent this excessive short-circuit current, self-turn-off devices S1 and S3 are operated reversely and self-turn-off devices S2 and S4 are also operated reversely.

Figure 23:
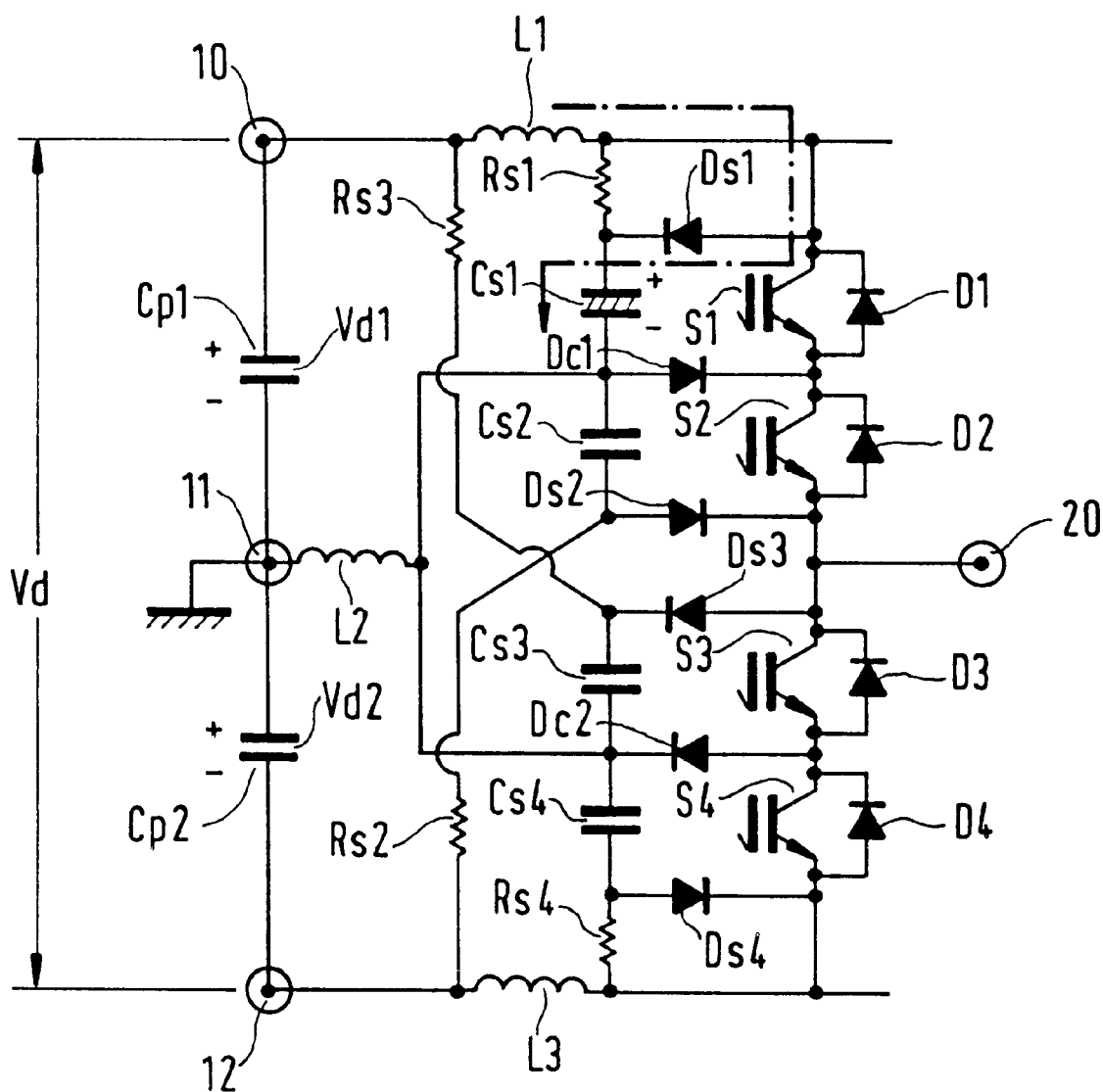
FIG. 23 is a diagram for explaining the charging operation of the snubber capacitor in the NPC inverter shown in FIG. 22.
Figure 24:
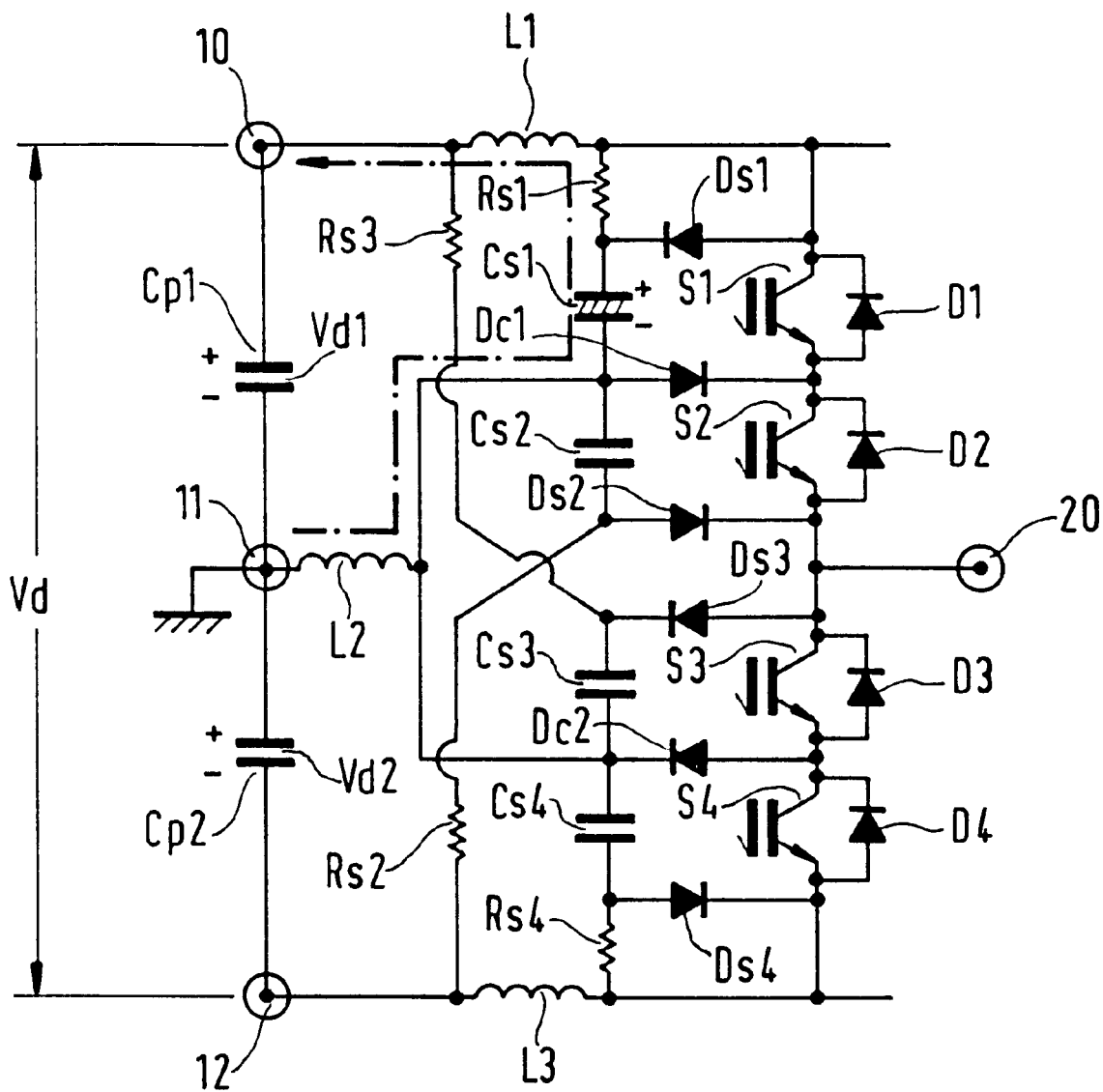
FIG. 24 is a diagram for explaining the discharging operation of the snubber capacitor and the snubber resistor in the NPC inverter shown in FIG. 22.
Figure 25:
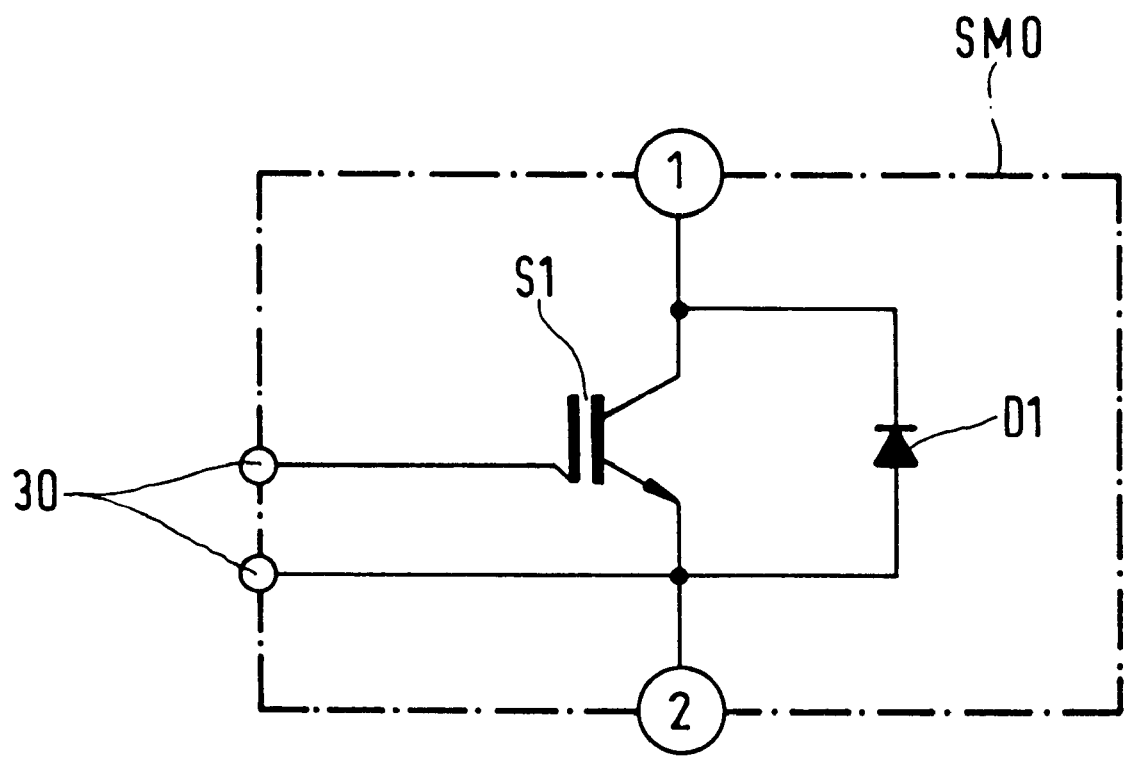
FIG. 25 is a diagram showing a configuration of one example of a conventional switching module.
Figure 26:
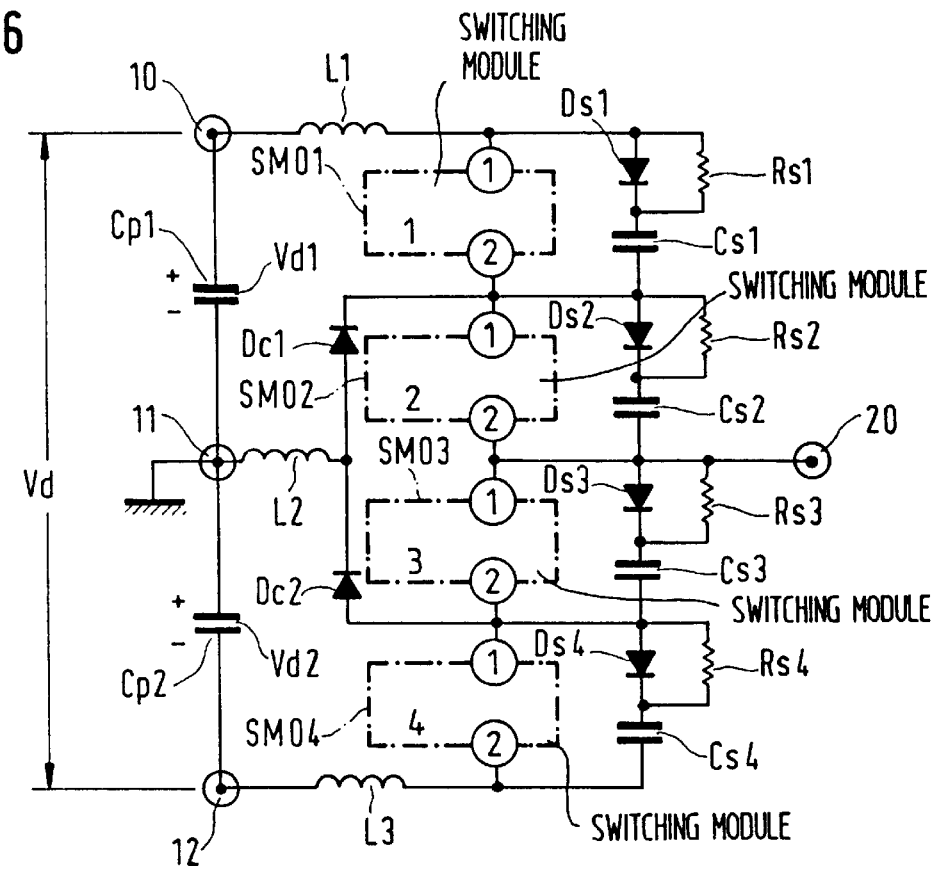
FIG. 26 is a circuit diagram showing one example of a conventional NPC inverter composed of using the switching modules shown in FIG. 25.
Figure 27:
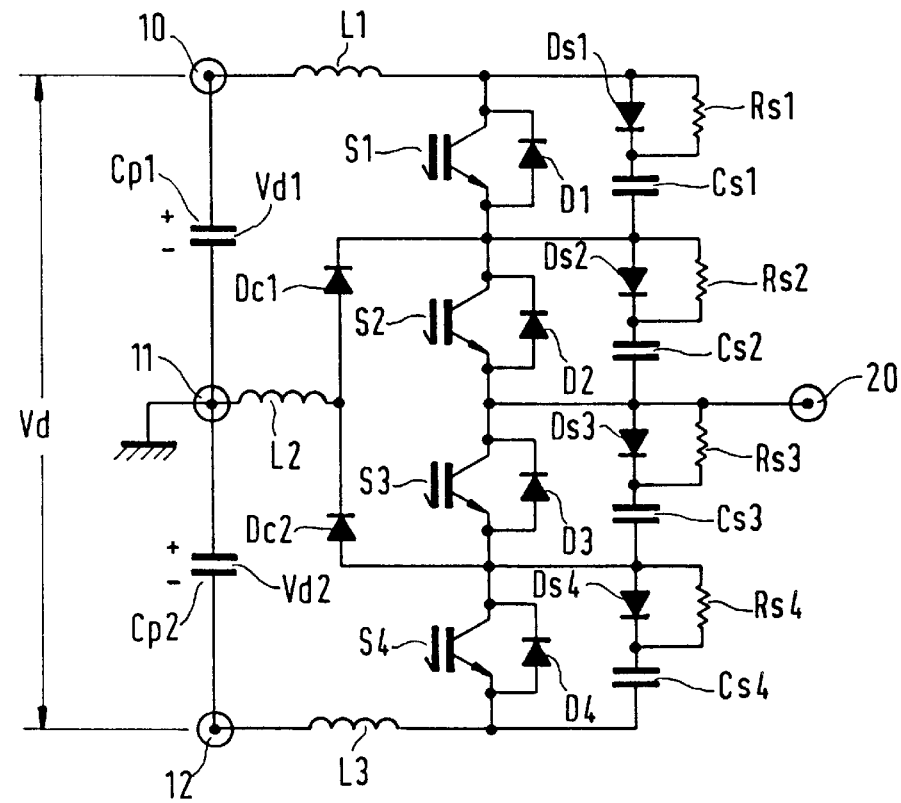
FIG. 27 is a circuit diagram of the NPC inverter shown in FIG. 26.
Figure 28:
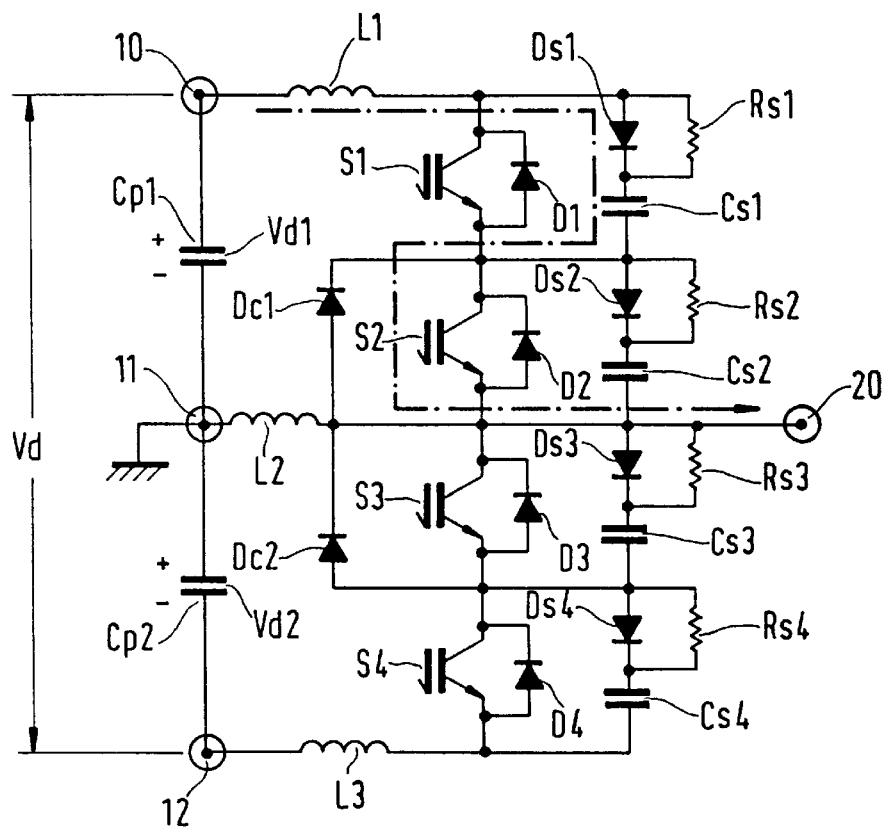
FIG. 28 is a diagram for explaining the charging operation of the snubber capacitor in the NPC inverter shown in FIG. 27.
Figure 29:
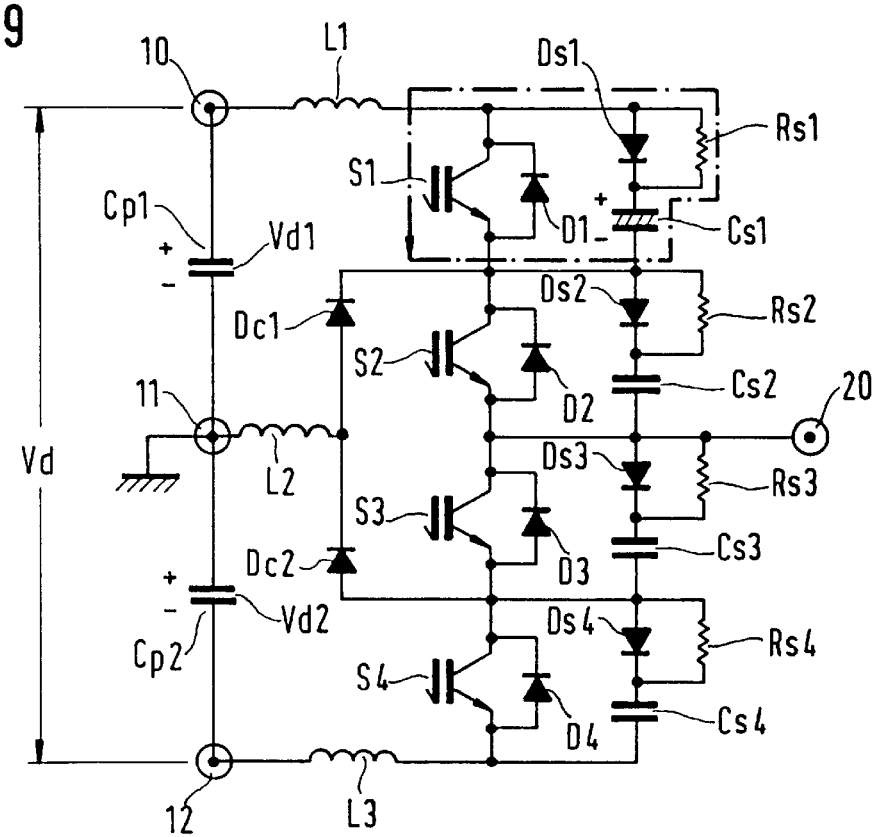
FIG. 29 is a diagram for explaining the discharging operation of the snubber capacitor in the NPC inverter shown in FIG. 27.

Assume the state wherein current is flowing through line inductance L1 and self-turn-off devices S1, S2. At this time, the voltage of snubber capacitor Cs1 is Vd1 and snubber capacitor Cs1 is already in the charged state. When self-turn-off device S1 is turned OFF, the voltage of self-turn-off device S1 is raised by the residual energy of line inductance L1. When the voltage exceeds the voltage of snubber capacitor Cs1, forward voltage is applied to snubber diode Ds1, which becomes then the ON state. As a result, the residual energy of line inductance L1 flows in and is absorbed by snubber capacitor Cs1. This state is shown in FIG. 23. At this time, the voltage of snubber capacitor Cs1 rises but is kept clamped at DC voltage Vd1, and therefore, excess voltage is discharged by snubber resistor Rs1 in the route of snubber capacitor Cs1→snubber resistor Rs1 as shown in FIG. 24 so that the voltage of snubber capacitor Cs1 becomes equal to voltage Vd1. As the voltage of self-turn-off device S1 is kept clamped at the voltage of snubber capacitor Cs1, the voltage of self-turn-off device S1 can be maintained almost at voltage Vd1.

Even when self-turn-off device S1 is turned ON again, snubber capacitor Cs1 does not discharge and maintains voltage Vd1. Thus, the loss consumed by snubber resistor Rs1 is only excess voltage charged in snubber capacitor Cs1. Accordingly, in this embodiment, the loss can be reduced sharply more than a conventional discharge type snubber circuit.

The operation of self-turn-off device S2 and its snubber circuit will be described. Assume the state wherein current is flowing through line inductance L2, clamp diode Dc1 and self-turn-off devices S2, S3. At this time, the voltage of snubber capacitor Cs2 is Vd2 and snubber capacitor Cs2 is in the already charged state. When self-turn-off device S2 is turned OFF, the voltage of self-turn-off device S2 is raised by the residual energy of line inductance L2. When the voltage of self-turn-off device S2 exceeds the voltage of snubber capacitor Cs2, forward voltage is applied to snubber diode Ds2, which becomes then the ON state. As a result, the residual energy of line inductance L2 flows in and is absorbed by snubber capacitor Cs2. At this time, the voltage of snubber capacitor Cs2 rises, but as it is kept clamped at voltage Vd2, excess voltage is discharged by snubber resistor Rs2 so that the voltage of snubber capacitor Cs2 becomes equal to voltage Vd2. Even when self-turn-off device S2 is turned ON again, snubber capacitor Cs2 is not discharged and the voltage of snubber capacitor Cs2 is maintained at Vd2. Therefore, the loss consumed by snubber resistor Rs2 is only excess voltage charged in snubber capacitor Cs2, and the voltage loss can be reduced sharply more than a conventional discharge type snubber circuit. Further, when compared with a conventional low-loss snubber circuit, in order for discharging excess voltage charged in snubber capacitor Cs2, self-turn-off device S2 must be turned ON again and self-turn-off device S3 must be also in the ON state in a conventional low-loss snubber circuit. While in the low-loss snubber circuit of NPC inverter PC4 according to the present invention, the voltages of snubber capacitor Cs2 and self-turn-off device S2 become steadily equal to DC voltage Vd2 regardless of the operating state of self-turn-off device S2.

The actions of the snubber circuits for self-turn-off devices S3 and S4 are also the same as those for self-turn-off devices S1 and S2 as described above. According to this embodiment, for instance, the control system disclosed in the Japanese Patent Disclosure (Kokai) No. Hei 4-295279 is also applicable to this embodiment. According to this control system, the loss can be reduced by eliminating the useless switching operation by turning only the self-turn-off devices ON which are required according to the direction of output current. For instance, when the output current is positive, self-turn-off devices S3 and S4 are kept in the OFF state. Further, when the output voltage is negative, self-turn-off devices S1 and S2 are kept in the OFF state. Thus, it becomes possible to eliminate the useless switching and reduce the switching loss.

The NPC inverter according to the present invention with this control system applied is compared with an NPC inverter equipped with conventional low-loss snubber circuits with this control system applied. It is assumed that self-turn-off device S2 is turned ON/OFF in the state wherein the output current is positive and self-turn-off devices S3 and S4 are in the OFF state. In order to discharge excess voltage charged in snubber capacitor Cs2 in a conventional low-loss snubber circuit, excess voltage charged in snubber capacitor Cs2 is not discharged unless self-turn-off device S2 is turned ON again and self-turn-off device S3 is also in the ON state. On the contrary, in the low-loss snubber circuit of NPC inverter PC4 according to the present invention, it is possible to discharge excess voltage of snubber capacitor Cs2 regardless of the operating state of self-turn-off device S2 and thereby to make the voltage of snubber capacitor Cs2 and that of self-turn-off device S2 steadily equal to DC voltage Vd2.

Snubber diodes Ds22 and Ds32 which are required in the conventional low-loss snubber circuits (FIGS. 30 and 31) are no longer required in the low-loss snubber circuits of NPC inverter PC4 according to the present invention.

It is assumed that, for instance, self-turn-off devices S1 and S2 are in the ON state.

In the circuit shown in FIG. 30, when self-turn-off devices S1 and S2 are in the ON state, the potential at the positive side terminal of snubber capacitor Cs2 becomes equal to the potential at positive side terminal 10 of DC voltage source as self-turn-off device S1 is in the ON state. When assuming that there is no snubber diode Ds22, a current flows through a series circuit of positive side terminal 10 of DC voltage source, snubber capacitor Cs2, snubber resistor Rs2 and negative side terminal 12 of DC voltage source. As a result, a current continues to flow through snubber resistor Rs2 thereby to increase loss by snubber resistor Rs2. To prevent this state, snubber diode Ds22 is connected as shown in FIG. 30 to prevent this current from flowing through snubber resistor Rs2.

In the circuit shown in FIG. 22, when self-turn-off devices S1 and S2 are in the ON state, the potential at the positive side terminal of snubber capacitor Cs2 becomes equal to the potential at zero-voltage terminal 11 of DC voltage source, and the potential at the negative side terminal of snubber capacitor Cs2 becomes nearly equal to the potential at negative side terminal 12 of DC voltage source. That is, even when self-turn-off device S1 is in the ON state, clamp diode Dc1 is connected between the negative side terminal of self-turn-off device S1 and the positive side terminal of snubber capacitor Cs2 in the direction as shown in FIG. 22, a current does not flow through snubber capacitor Cs2. As a result, it does not occur that total voltage Vd of the DC voltage source is applied to snubber capacitor Cs2.

For the above-described action, in the low-loss snubber circuit of the NPC inverter according to the present invention, it does not occur that the total voltage of the DC voltage source is applied to snubber capacitor Cs2 or Cs3, which is a problem in a conventional low-loss snubber circuit.

According to the embodiment shown in FIG. 22, it is possible to provide an NPC inverter equipped with low-loss snubber circuits. Further, when compared with an NPC inverter equipped with conventional low-loss snubber circuits, the NPC inverter of this invention has such a merit that the switching control of the self-turn-off devices is not restricted and also, it does not require external snubber diodes Ds22, Ds32 which are required in conventional low-loss snubber circuits, and thus, the number of diodes can be reduced.

As is clear from what have been described in the above, such the effects as shown below can be obtained according to the present invention.

1. According to the switching module of the present invention, it is possible to make the external wirings most short, reduce line inductances in a main circuit of the power converter and downsize the entire system of the power converter. In particular, by making the wiring length between the clamp diode and the self-turn-off devices most short, it is possible to provide switching modules which facilitates to compose a low-loss snubber circuit in a neutral point clamped inverter. In addition, it is possible to provide switching modules that are commonly usable for a 2-level inverter and a 3-level inverter (a neutral point clamped inverter) and are adaptable to the standardization.

2. It is possible to provide a neutral point clamped inverter equipped with the low-loss snubber circuits of the present invention capable of reducing the number of component parts. Furthermore, it is possible to provide a highly efficient power converter equipped with low-loss snubber circuits, which does not depend on the switching control system in the discharging operation of a snubber capacitor.

3. It is further possible to provide a highly efficient power converter composed of using the switching module, equipped with low-loss snubber circuits.

Obviously, numerous modifications and variations of the present invention are possible in light of the above teachings. It is therefore to be understood that within the scope of the appended claims, the invention may be practiced otherwise than as specifically described herein.

What is claimed is:

1. A switching module, comprising:
   a first self-turn-off device;
   a second self-turn-off device connected in series with said first self-turn-off device;
   a first diode connected in antiparallel with said first self-turn-off device;
   a second diode connected in antiparallel with said second self-turn-off device;
   a third diode with its cathode connected to a connecting point of said first and second self-turn-off devices;
   a first external terminal connected to a positive side terminal of said first self-turn-off device;
   a second external terminal connected to a negative side terminal of said second self-turn-off device;
   a third external terminal connected to an anode of said third diode;
   a first external control terminal connected to a control signal terminal of said first-turn-off device;
   a second external control terminal connected to a control signal terminal of said second self-turn-off device; and a fourth external terminal connected to said connecting point of said first and second self-turn-off devices.

2. A switching module, comprising:

a first self-turn-off device;

a second self-turn-off device connected in series with said first self-turn-off device;

a first diode connected in antiparallel with said first self-turn-off device;

a second diode connected in antiparallel with said second self-turn-off device;

a third diode with its cathode connected to a connecting point of said first and second self-turn-off devices;

a first external terminal connected to a positive side terminal of said first self-turn-off device;

a second external terminal connected to negative side terminal of said second self-turn-off device;

a third external terminal connected to an anode of said third diode;

a first external control terminal connected to a control signal terminal of said first self-turn-off device;

a second external control terminal connected to a control signal terminal of said second self-turn-off device;

a fourth diode with its anode connected to said positive side terminal of said first self-turn-off device;

a fifth diode with its cathode connected to said negative side terminal of said second self-turn-off device;

a fourth external terminal connected to a cathode of said fourth diode; and a fifth external terminal connected to an anode of said fifth diode.

3. The switching module according to claim 2, further comprising:

a sixth external terminal connected to said connecting point of said first and second self-turn-off devices.

4. A switching module, comprising:

a first self-turn-off device;

a second self-turn-off device connected in series with said first self-turn-off device;

a first diode connected in antiparallel with said first self-turn-off device;

a second diode connected in antiparallel with said second self-turn-off device;

a third diode with its anode connected to a connecting point of said first and second self-turn-off devices;

a first external terminal connected to a positive side terminal of said first self-turn-off device;

a second external terminal connected to a negative side terminal of said second self-turn-off device;

a third external terminal connected to a cathode of said third diode;

a first external control terminal connected to a control signal terminal of said first self-turn-off device; and a second external control terminal connected to a control signal terminal of said second self-turn-off device.

5. The switching module according to claim 4, further comprising:

a fourth external terminal connected to said connecting point of said first and second self-turn-off devices.

6. The switching module according to claim 4, further comprising:

a fourth diode with its anode connected to said positive side terminal of said first self-turn-off device;

a fifth diode with its cathode connected to said negative side terminal of said second self-turn-off device;

a fourth external terminal connected to a cathode of said fourth diode; and a fifth external terminal connected to an anode of said fifth diode.

7. The switching module according to claim 6, further comprising:

a sixth external terminal connected to said connecting point of said first and second self-turn-off devices.

* * * * *

UNITED STATES PATENT AND TRADEMARK OFFICE
CERTIFICATE OF CORRECTION

PATENT NO. : 6,084,788

DATED      : July 4, 2000

INVENTOR(S): Mami MIZUTANI

It is certified that an error appears in the above-identified patent and that said Letters Patent is hereby corrected as shown below:

On the title page, item [54], and at the top of Column 1, the Title is incorrect. It should read:

--[54]  SWITCHING MODULE--

Signed and Sealed this

Third Day of April, 2001

*Attest:*

NICHOLAS P. GODICI

*Attesting Officer*    *Acting Director of the United States Patent and Trademark Office*